United States Patent
Furukawa

(10) Patent No.: US 6,990,623 B2
(45) Date of Patent: Jan. 24, 2006

(54) METHOD FOR ERROR DETECTION/CORRECTION OF MULTILEVEL CELL MEMORY AND MULTILEVEL CELL MEMORY HAVING ERROR DETECTION/CORRECTION FUNCTION

(75) Inventor: Hideyuki Furukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 481 days.

(21) Appl. No.: 10/146,074

(22) Filed: May 16, 2002

(65) Prior Publication Data

US 2003/0061560 A1    Mar. 27, 2003

Related U.S. Application Data

(63) Continuation-in-part of application No. 09/962,148, filed on Sep. 26, 2001, now abandoned.

(30) Foreign Application Priority Data

May 16, 2001  (JP) .............................. 2001-146536
Feb. 21, 2002  (JP) .............................. 2002-045116

(51) Int. Cl.
*G11C 29/00*  (2006.01)

(52) U.S. Cl. ..................................... 714/773
(58) Field of Classification Search ............... 714/773
See application file for complete search history.

(56) References Cited

U.S. PATENT DOCUMENTS 5,883,903 A      3/1999 Higashitani
5,942,004 A      8/1999 Cappelletti
5,996,108 A     11/1999 Tanzawa et al.
6,023,781 A *    2/2000 Hazama ...................... 714/773
6,209,113 B1    3/2001 Roohparvar
6,233,717 B1    5/2001 Choi
6,279,133 B1    8/2001 Vafai et al.
6,289,481 B1 *  9/2001 Egawa ......................... 714/746
6,307,776 B1   10/2001 So et al.
6,510,537 B1    1/2003 Lee
6,532,556 B1    3/2003 Wong et al.
6,557,138 B1 *  4/2003 Modelli ....................... 714/753
6,674,385 B2    1/2004 Micheloni et al.

FOREIGN PATENT DOCUMENTS

JP    10-334697    12/1998
JP    11-339496    12/1999

* cited by examiner

*Primary Examiner*—Stephen M. Baker
(74) *Attorney, Agent, or Firm*—Arent Fox PLLC

(57)    ABSTRACT

Binary bit addresses for error detection designating the individual bits of multilevel memory cells for retaining two bits of data, respectively, are assigned so that pairs of the binary bit addresses corresponding to each of the memory cells are mutually exclusive in each digit. For each digit of the binary bit addresses, first parity codes including a parity code of data corresponding to all the binary bit addresses having "0" in the digit and a parity code of data corresponding to all the binary bit addresses having "1" in the digit are generated for both write data and read data. The presence of a memory cell storing erroneous data in both bits is detected when all the first parity codes of the read data are different from the first parity codes of the write data. Thus, the multilevel cell memory can perform reliable error detection/correction by a simple method.

17 Claims, 30 Drawing Sheets

| parity code P | binary bit address BA subjected to parity generation | parity code WP in write operation | parity code RP in read operation | XP (WP XOR RP) |
|---|---|---|---|---|
| P0 | (*...*0) | WP0 | RP0 | XP0 |
| P1 | (*...*1) | WP1 | RP1 | XP1 |
| P2 | (*...0*) | WP2 | RP2 | XP2 |
| P3 | (*...1*) | WP3 | RP3 | XP3 |
| ⋮ | ⋮ | ⋮ | ⋮ | ⋮ |
| Pm-4 | (*0*...****) | WPm-4 | RPm-4 | XPm-4 |
| Pm-3 | (*1*...****) | WPm-3 | RPm-3 | XPm-3 |
| Pm-2 | (0**...****) | WPm-2 | RPm-2 | XPm-2 |
| Pm-1 | (1...**) | WPm-1 | RPm-1 | XPm-1 | m=2log₂(n)   *: arbitrary value binary bit address BA having an error = (XPm-1, XPm-3, ..., XP3, XP1)

⇩ obtain physical bit address PA having an error

⇩ invert and output data read from physical bit address PA having an error (error correction)

Prior Art

| physical bit address PA(decimal) | binary bit address BA | write data WD | read data RD |
|---|---|---|---|
| 0 | 000 | 0 | 0 |
| 1 | 001 | 1 | 1 |
| 2 | 010 | 1 | error → 0 |
| 3 | 011 | 0 | 0 |
| 4 | 100 | 1 | 1 |
| 5 | 101 | 0 | 0 |
| 6 | 110 | 0 | 0 |
| 7 | 111 | 1 | 1 | memory cell
lower bit
upper bit
read / write

Fig. 1

Prior Art

| parity code | binary bit address BA subjected to parity generation | parity code WP in write operation | parity code RP in read operation | WP xor RP |
|---|---|---|---|---|
| P0 | 000[0,0], 010[1,0], 100[1,1], 110[0,0] | (**0)  0 | 1 | 1 |
| P1 | 001[1,1], 011[0,0], 101[0,0], 111[1,1] | (**1)  0 | 0 | 0 |
| P2 | 000[0,0], 001[1,1], 100[1,1], 101[0,0] | (*0*)  0 | 0 | 0 |
| P3 | 010[1,0], 011[0,0], 110[0,0], 111[1,1] | (*1*)  0 | 1 | 1 |
| P4 | 000[0,0], 001[1,1], 010[1,0], 011[0,0] | (0**)  0 | 1 | 1 |
| P5 | 100[1,1], 101[0,0], 110[0,0], 111[1,1] | (1**)  0 | 0 | 0 |

[write data WD, read data RD]   *: arbitrary value

Fig. 2

| parity code CP | binary cell address BCA subjected to parity generation | parity code WCP in write operation | parity code RCP in read operation | XRP (WCP xor RCP) |
|---|---|---|---|---|
| CP0 | (*...*1) | WCP0 | RCP0 | XRP0 |
| CP1 | (*...1*) | WCP1 | RCP1 | XRP1 |
| CP2 | (***...*1**) | WCP2 | RCP2 | XRP2 |
| ~ | ~ | ~ | ~ | ~ |
| CPj-3 | (1...**) | WCPj-3 | RCPj-3 | XRPj-3 |
| CPj-2 | (*1*...****) | WCPj-2 | RCPj-2 | XRPj-2 |
| CPj-1 | (1...**) | WCPj-1 | RCPj-1 | XRPj-1 | j=log2(n/2)    *: arbitrary value binary cell address BCA having an error = (XRPj-1, XRPj-2, ..., XRP1, XRP0)

⇨ obtain physical cell address PCA having an error

⇨ obtain physical bit address PA having an error

⇨ invert and output data read from physical bit address PA having an error (error correction)

Fig. 6

| parity code | binary bit address BA subjected to parity generation | | | | | | parity code WP in write operation | parity code RP in read operation | XP (WP xor RP) | |
|---|---|---|---|---|---|---|---|---|---|---|
| P0 | 000[0,0], | 010[1,1], | 100[1,1], | 110[0,0] | | (**0) | 0 | 0 | 0 | (XP0) |
| P1 | 001[1,0], | 011[0,0], | 101[0,0], | 111[1,1] | | (**1) | 0 | 1 | 1 | (XP1) |
| P2 | 000[0,0], | 001[1,0], | 100[1,1], | 101[0,0] | | (*0*) | 0 | 1 | 1 | (XP2) |
| P3 | 010[1,1], | 011[0,0], | 110[0,0], | 111[1,1] | | (*1*) | 0 | 0 | 0 | (XP3) |
| P4 | 000[0,0], | 001[1,0], | 010[1,1], | 011[0,0] | | (0**) | 0 | 1 | 1 | (XP4) |
| P5 | 100[1,1], | 101[0,0], | 110[0,0], | 111[1,1] | | (1**) | 0 | 0 | 0 | (XP5) |

[write data WD, read data RD]  *: arbitrary value binary bit address BA having an error = "001"
⇒ physical bit address PA having an error = 2
⇒ invert and output data read from PA = 2

Fig. 11

| parity code | binary bit address BA subjected to parity generation | parity code WP in write operation | parity code RP in read operation | XP (WP xor RP) |
|---|---|---|---|---|
| P0 | 000[0,0], 010[1,1], 100[1,1], 110[0,1] | (**0) | 1 | 1 |
| P1 | 001[1,0], 011[0,0], 101[0,0], 111[1,1] | (**1) | 1 | 1 |
| P2 | 000[0,0], 001[1,0], 100[1,1], 101[0,0] | (*0*) | 1 | 1 |
| P3 | 010[1,1], 011[0,0], 110[0,1], 111[1,1] | (*1*) | 1 | 1 |
| P4 | 000[0,0], 001[1,0], 010[1,1], 011[0,0] | (0**) | 1 | 1 |
| P5 | 100[1,1], 101[0,0], 110[0,1], 111[1,1] | (1**) | 1 | 1 |

[write data WD, read data RD], *: arbitrary value

Fig. 13

| parity code | binary cell address BCA subjected to parity generation | parity code WCP in write operation | parity code RCP in read operation | XRP (WCP xor RCP) |
|---|---|---|---|---|
| CP0 | 01[0,0], 11[1,1] | (*1) | 0 | 1 |
| CP1 | 10[1,0], 11[0,0] | (1*) | 1 | 0 |

[write data WD, read data RD]   *: arbitrary value binary cell address BCA having an error = "01"
⇒ physical cell address PCA having an error = 1
⇒ physical bit address PA = 2, 3 having an error
⇒ invert and output data read from PA = 2, 3 (error correction)

Fig. 14

| parity code | binary bit address BA subjected to parity generation | parity code WP in write operation | parity code RP in read operation | XP (WP xor RP) |
|---|---|---|---|---|
| P0 | 000[0,0], 010[1,1], 100[1,1], 110[0,0] (**0) | 0 | 0 | 0 |
| P1 | 001[1,0], 011[0,0], 101[0,0], 111[1,0] (**1) | 0 | 0 | 0 |
| P2 | 000[0,0], 001[1,0], 100[1,1], 101[0,0] (*0*) | 0 | 1 | 1 |
| P3 | 010[1,1], 011[0,0], 110[0,0], 111[1,0] (*1*) | 0 | 1 | 1 |
| P4 | 000[0,0], 001[1,0], 010[1,1], 011[0,0] (0**) | 0 | 1 | 1 |
| P5 | 100[1,1], 101[0,0], 110[0,0], 111[1,0] (1**) | 0 | 1 | 1 |

[write data WD, read data RD]    *: arbitrary value occurrence of two- or- more- bit error across a plurality of memory cells

Fig. 16

| BA1 (binary) | PA (decimal) | data |
|---|---|---|
| 000..0000 | 0 | D(0) |
| 000..0001 | m | D(m) |
| 000..0010 | 2m | D(2m) |
| 000..0011 | 3m | D(3m) |
| 000..0100 | 4m | D(4m) |
| 000..0101 | 5m | D(5m) |
| 000..0110 | 6m | D(6m) |
| 000..0111 | 7m | D(7m) |
| ~ | ~ | ~ |
| 111..1000 | 7m+1 | D(7m+1) |
| 111..1001 | 6m+1 | D(6m+1) |
| 111..1010 | 5m+1 | D(5m+1) |
| 111..1011 | 4m+1 | D(4m+1) |
| 111..1100 | 3m+1 | D(3m+1) |
| 111..1101 | 2m+1 | D(2m+1) |
| 111..1110 | m+1 | D(m+1) |
| 111..1111 | 1 | D(1) |

Fig. 20

| first parity code PC1 | binary first address BA1 subjected to parity generation | logical expression of parity code |
|---|---|---|
| L0A1 | (*...*0) | D(0) xor D(2m) xor D(4m) xor ...... xor D(3m+1) xor D(m+1) |
| H0A1 | (*...*1) | D(m) xor D(3m) xor D(5m) xor ...... xor D(2m+1) xor D(1) |
| L1A1 | (*...0*) | D(0) xor D(m) xor D(4m) xor ...... xor D(3m+1) xor D(2m+1) |
| H1A1 | (*...1*) | D(2m) xor D(3m) xor D(6m) xor ...... xor D(m+1) xor D(1) |
| ~ | | ~ |
| L(log2(2n/m)-1)A1 | (0**...****) | D(0) xor D(m) xor D(2m) xor ...... xor D(n-2m) xor D(n-m) |
| H(log2(2n/m)-1)A1 | (1**...****) | D(n-m+1) xor D(n-2m+1) xor D(n-3m+1) xor ...... xor D(m+1) xor D(1) |

*: arbitrary value

Fig. 21

| BA2 (binary) | PA (decimal) | data |
|---|---|---|
| 00..000 | 0 | D(0) |
| 00..001 | m | D(m) |
| 00..010 | 2m | D(2m) |
| 00..011 | 3m | D(3m) |
| 00..100 | 4m | D(4m) |
| 00..101 | 5m | D(5m) |
| 00..110 | 6m | D(6m) |
| 00..111 | 7m | D(7m) |
| ~ | ~ | ~ |
| 11..001 | n-7m | D(n-7m) |
| 11..010 | n-6m | D(n-6m) |
| 11..011 | n-5m | D(n-5m) |
| 11..100 | n-4m | D(n-4m) |
| 11..101 | n-3m | D(n-3m) |
| 11..110 | n-2m | D(n-2m) |
| 11..111 | n-m | D(n-m) |

Fig. 22

| second parity code PC2 | binary second address BA2 subjected to parity generation | logical expression of parity code |
|---|---|---|
| H0B1 | (...1) | D(m) xor D(3m) xor D(5m) xor ...... xor D(n-3m) xor D(n-m) |
| H1B1 | (**...*1*) | D(2m) xor D(3m) xor D(6m) xor ...... xor D(n-2m) xor D(n-m) |
| ~ | ~ | ~ |
| H(log₂(n/m)-1)B1 | (1*...***) | D(n/2) xor D(n/2+m) xor D(n/2+2m) xor ...... xor D(n-2m) xor D(n-m) |

*: arbitrary value

Fig. 23

| first parity code PC1 | binary first address BA1 subjected to parity generation | first parity code WLjA1,WHjA1 in write operation | first parity code RLjA1,RHjA1 in read operation | XLjA1,XHjA1 (WP xor RP) |
|---|---|---|---|---|
| L0A1 | 000, 010, 100, 110 (**0) | WL0A1 | RL0A1 | XL0A1 |
| H0A1 | 001, 011, 101, 111 (**1) | WH0A1 | RH0A1 | XH0A1 |
| L1A1 | 000, 001, 100, 101 (*0*) | WL1A1 | RL1A1 | XL1A1 |
| H1A1 | 010, 011, 110, 111 (*1*) | WH1A1 | RH1A1 | XH1A1 |
| L2A1 | 000, 001, 010, 011 (0**) | WL2A1 | RL2A1 | XL2A1 |
| H2A1 | 100, 101, 110, 111 (1**) | WH2A1 | RH2A1 | XH2A1 | j=0~2

*: arbitrary value

Fig. 28

| second parity code PC2 | binary second address BA2 subjected to parity generation | second parity code WHjB1 in write operation | second parity code RHjB1 in read operation | XHjB1 (WP xor RP) |
|---|---|---|---|---|
| H0B1 | 01, 11 (*1) | WH0B1 | RH0B1 | XH0B1 |
| H1B1 | 10, 11 (1*) | WH1B1 | RH1B1 | XH1B1 |

*: arbitrary value j=0~1

Fig. 29

METHOD FOR ERROR DETECTION/CORRECTION OF MULTILEVEL CELL MEMORY AND MULTILEVEL CELL MEMORY HAVING ERROR DETECTION/CORRECTION FUNCTION

CROSS REFERENCE TO RELATED APPLICATION

This application is a continuation-in-part application of U.S. application Ser. No. 09/962,148, filed Sep. 26, 2001 now abandoned.

BACKGROUND OF THE INVENTION

1. Field of the Invention

The invention relates to a method for error detection/correction of a multilevel cell memory which can store a plurality of bits of information in each single memory cell.

2. Description of the Related Art

In general, semiconductor memories store a single bit of information in each single memory cell thereof. In writing and reading data, such semiconductor memories as a flash memory generate simple error correcting codes (ECCs) by access to their memory cells, and compare these ECCs to perform the detection/correction of single-bit errors.

FIGS. 1 and 2 show a method for detecting/correcting a single-bit error in a flash memory. For simplicity, the following description deals with the case of accessing (writing/reading) memory cells in steps of eight bits. In actual flash memories, read operations and write operations are performed, for example, in steps of 4096 bits. In this embodiment, odd parity codes are used as ECCs.

In this example, data bits grouped by the value in one bit of their binary bit addresses BA, there being a group identified for each address bit for each address bit value thereof, are used to generate parity codes. Binary bit addresses BA are binary representations of physical bit addresses PA which designate individual memory cells. Since eight memory cells are in question, a binary bit address BA is composed of three bits. Hereinafter, description will be given of the case where write data WD of "10010110" in binary is written to the memory cells, and read data RD of "10010010" in binary is read from the memory cells. That is, a data error occurs in the memory cell having a physical bit address PA of "2".

As shown in FIG. 2, the number of bits of parity codes P0–P5 is set at six bits, or twice the number of bits of a binary bit address BA. The parity code P0 is calculated from the data corresponding to four binary bit addresses BA that have "0" in their least significant digits. That is, the parity code P0 is generated from the data to be written/read under four physical bit addresses "0", "2", "4", and "6" corresponding to binary bit addresses "000", "010", "100", and "110".

The parity code P1 is calculated from the data corresponding to four binary bit addresses BA that have "1" in their least significant digits. That is, the parity code P1 is generated from the data to be written/read under four physical bit addresses "1", "3", "5", and "7" corresponding to binary bit addresses "001", "011", "101", and "111".

Similarly, the parity codes P2 and P4 are calculated from the data corresponding to four binary bit addresses BA that have "0" in their second digits and third digits (most significant digits), respectively. The parity codes P3 and P5 are the parities of data corresponding to four binary bit addresses BA that have "1" in their second digits and third digits (most significant digits), respectively.

In this way, each bit of writing parity code WP and each bit of reading parity code RP are obtained from predetermined four bits of the write data WD ("10010110") and predetermined four bits of the read data RD ("10010010") shown in FIG. 1.

The parity codes P0–P5 are generated for situations where binary bit addresses BA have "0" or "1" in respective digits as described above. Therefore, when a single-bit error occurs, comparisons between the individual bits of the parity codes WP and RP indicate that either of the parity codes P0 and P1, either of the parity codes P2 and P3, and either of the parity codes P4 and P5 are inverted. Specifically, as shown in FIG. 2, the underlined error-occurring binary bit address BA ("010") is included in either of the parity codes P0 and P1, in either of the parity codes P2 and P3, and in either of the parity codes P4 and P5. Therefore, if the exclusive ORs of the parities P0–P5 and the parities WP and RP (WP XOR RP) indicate differences between the parity codes P0 and P1, between the parity codes P2 and P3, and between the parity codes P4 and P5, then a single-bit error is detected. Here, the value of the error-occurring binary bit address BA is given by arranging the parity codes P5, P3, and P1 ("010" in this example). Then, the data read from this address is inverted for error correction.

Recently, the data amount to be handled in portable equipment with flash memory mounted, and the like, has been on the increase, requiring flash memories of yet larger capacities. For this reason, there have been developed four-level cell flash memories which can store two bits of information in each single memory cell.

FIG. 3 shows the relationship between logical values of data and threshold voltage VTH in a flash memory that can store two bits of information in each single memory cell.

For example, when a memory cell has a threshold voltage VTH lower than the reference voltage V1, the data retained in the memory cell is "00". When the threshold voltage VTH of a memory cell falls within the range of the reference voltages V1 and V2 the data retained in the memory cell is "01". When the threshold voltage VTH of a memory cell falls within the range of the reference voltages V2 and V3 the data retained in the memory cell is "10". When the threshold voltage VTH of a memory cell exceeds the reference voltage V3 the data retained in the memory cell is "11". In the flash memory of this type, memory cell currents which vary with the threshold voltage VTH are compared with a plurality of reference currents to read data retained in the memory cells.

Four-level cell flash memories having memory cells capable of storing two bits of information can lose control of threshold voltages in write operations if defects occur among the memory cells. This means higher chances of a two-bit error in the same memory cell. Accordingly, multi-level cell flash memories of this type cannot fully relieve defects by simply performing the detection/correction of single-bit errors.

The four-level cell flash memory described above can adopt a conventional technique for detecting/correcting two-bit errors to improve the error-detection/correction efficiencies. Nevertheless, conventional circuits for detecting/correcting two-bit errors are far more complicated than those for detecting/correcting single-bit errors. Therefore, the implementation of a two-bit error detecting/correcting circuit on a flash memory has caused problems of greater chip sizes and increased fabrication costs. Moreover, a two-bit error detecting/correcting circuits have longer error-detecting/correcting times as compared with single-bit error detecting/correcting circuits. This may preclude error correction within read cycle time when four-level cell flash memories capable of high-speed reading are developed in the future.

Furthermore, semiconductor memories that store eight levels and sixteen levels in each single memory cell are apt to three-bit errors and four-bit errors, respectively. Nevertheless, there has been proposed no error-detection/correction technique that is tailored to a multi-bit defect occurring in a single multilevel memory cell.

SUMMARY OF THE INVENTION

An object of the present invention is to provide a multilevel cell memory capable of storing a plurality of bits of information in each single memory cell, in which reliable error detection/correction is performed by a simple method.

Another object of the present invention is to provide a multilevel cell memory capable of storing a plurality of bits of information in each single memory cell, in which error detection and error correction are achieved by a simple circuit without an increase in chip size.

According to one of the aspects of the present invention, error detection parity bits are generated from data bits grouped by properties of their bit addresses, the bit addresses designating individual bits of multilevel memory cells capable of retaining two data bits, and for every multilevel memory cell the two data bits are assigned bit addresses different from each other in every bit address digit. For each digit of the binary bit addresses, first parity codes including a parity code of write data corresponding to all of the binary bit addresses having "0" in the digit and a parity code of write data corresponding to all of the binary bit addresses having "1" in the digit are generated.

When data are read from the memory cells, first parity codes of read data corresponding to the binary bit addresses whose combinations are the same as at the generation of the first parity codes of the write data are generated. That is, in reading data, first parity codes including a parity code of read data corresponding to all of the binary bit addresses having "0" in the digit and a parity code of the read data corresponding to all the binary bit addresses having "1" in the digit are generated for each digit of the binary bit addresses.

Then, the presence of a memory cell storing erroneous data in both bits is detected when the first parity codes generated in the read operation are all different from the first parity codes generated in the write operation.

The assigning of the binary bit addresses and the generation of the first parity codes are performed, for example, by a first generating circuit of the multilevel cell memory. A single memory cell having a two-bit error is detected, for example, by a first detecting circuit of the multilevel cell memory.

Simply combining the binary bit addresses to be assigned to each single memory cell so as to be mutually inverted in every bit allows the detection of a single memory cell having a two-bit error. For this reason, the first generating circuit and the first detecting circuit can be formed in a simple configuration. Therefore, reliable error detection/correction can be performed by a simple method in the multilevel cell memory capable of storing a plurality of bits of information in each single memory cell.

Since the error detection can be achieved by a simple circuit, the implementation of a circuit for detecting a two-bit error in a single memory cell causes no increase in the chip size of the multilevel cell memory.

According to another aspect of the present invention, binary cell addresses for error correction are assigned to the individual memory cells. For the binary cell addresses, second parity codes of read data for all memory cells having the same binary cell address digit combinations used for the generation of the second parity codes of the write data are generated. When the presence of memory cells storing erroneous data in both bits is detected, second parity codes of read data for all memory cells having the same binary cell address digit combinations used for the generation of the second parity codes of the write data are generated.

The exclusive ORs are obtained from the individual bits of the second parity code generated in the write operation and the individual bits of the second parity code generated in the read operation. The obtained exclusive ORs are assigned to respective digits of the address to determine a binary cell address having an error.

The error is corrected by inverting two bits of data read from a memory cell having the error.

The assigning of the binary cell addresses and the generation of the second parity codes are performed, for example, by a second generating circuit of the multilevel cell memory. A two-bit error occurring in a single memory cell is corrected, for example, by a first correcting circuit of the multilevel cell memory.

Since the second parity codes are generated from data selected on the basis of cell addresses, the second generating circuit can be formed in a simple configuration. Therefore, a two-bit error in a single memory cell, can be corrected easily by a simple circuit.

Since the error correction can be achieved by a simple circuit, the implementation of a circuit for correcting a two-bit error in a single memory cell causes no increase in the chip size of the multilevel cell memory.

According to another aspect of the present invention, the exclusive ORs are obtained from the first parity codes generated in the write operation and the first parity codes generated in the read operation. When each pair of the exclusive ORs corresponding to complementary values for each of the binary address digits concerned at the generation of the first parity codes has complementary values, it is detected that data read from the memory cells includes a single-bit error.

Either exclusive OR of each pair of exclusive ORs is assigned to designate a value for a respective digit of the bit address of the detected error. The error is corrected by inverting data corresponding to the binary bit address among data read from the memory cells.

The detection of a single-bit error is performed, for example, by a second detecting circuit of the multilevel cell memory. The correction of a single-bit error is performed, for example, by a second correcting circuit of the multilevel cell memory.

Since the first parity codes used to detect a two-bit error in a single memory cell can be utilized for the detection/correction of a single-bit error, the function of detecting/correcting a single-bit error can be added without increasing the scale of the error detection/correction circuit. That prevents an increase in the chip size of the multilevel cell memory.

According to another aspect of the multilevel cell memory having an error detection/correction function in the present invention, the semiconductor memory comprises a converting circuit for converting each bit of the first parity codes into two-bit data, and multilevel memory cells for retaining the first parity codes as the two bit data.

According to another aspect of the multilevel cell memory having an error detection/correction function in the present invention, the semiconductor memory comprises a converting circuit for converting each bit of the second parity codes into two-bit data, and multilevel memory cells for retaining the second parity codes as the two bit data. Maintaining only two possible logical values (representing 1 bit) for each of the first and second parity codes as converted into multilevel values enables a reduction in the probability of error occurrence in these parity codes. That is, the parity codes to be stored into the multilevel memory cells can be improved in reliability. As a result, the error detection/correction can be performed without fail.

According to another aspect of the present invention, a plurality of first groups are constituted by selecting two bits as a bit pair from each memory cell for retaining a plurality of bits of data. Then, for each of the first groups, two binary first addresses designating each bit pair of the memory cells are assigned so that these binary first addresses are different from each other in every bit address digit as described above. Next, for each digit of the binary first addresses generated are first parity codes including a parity code of write data corresponding to all of the binary first addresses having "0" in the digit and a parity code of write data corresponding to all of the binary first addresses having "1" in the digit.

When first parity codes generated in data read operation from the memory cells and the first parity codes generated in data write operation are all different from each other, in an area allocated to each of the first groups the presence of one memory cell storing erroneous data in both bits of a bit pair thereof is detected. The assigning of the binary first addresses and the generation of the first parity codes are performed, for example, by a first generating circuit of the multilevel cell memory. The detection of one memory cell having erroneous data in both bits of a bit pair is performed, for example, by a first detecting circuit of the multilevel cell memory.

Since the memory cells are divided into a plurality of bit pairs and the individual bit pairs are assigned to a plurality of first groups, it is able to detect a memory cell: having erroneous data in both bits of a bit pair thereof for each of the first groups even with the multilevel memory cells each for storing more than two bits of data. That is, errors in the multilevel memory cells can be detected by a simple method.

According to another aspect of the present invention, a plurality of second groups corresponding to the first groups are constituted by selecting either of bits of the bit pairs in the respective first groups. Then, for each of the second groups, binary second addresses for error correction designating the selected bits are assigned to the individual memory cells. Next, for each digit of the binary second addresses generated are second parity codes of write data corresponding to all of the binary second addresses having "0" in the digit or second parity codes of write data corresponding to all of the binary second addresses having "1" in the digit.

For each of the second groups corresponding to the first groups generated are second parity codes of data read from the bits of the memory cells corresponding to the binary second addresses whose combinations are the same as at the generation of the second parity codes of the write data. When the presence of one memory cell storing erroneous data in both bits of a bit pair thereof is detected, exclusive ORs of individual bits of the second parity codes generated in the write operation and individual bits of the second parity codes generated in the read operation are obtained. The obtained exclusive ORs are assigned to respective digits of a binary number to determine a binary second address having an error. Then, the error is corrected by inverting two bits of data read from the memory cell having the error.

The assigning of the binary second addresses and the generation of the second parity codes are performed, for example, by a second generating circuit of the multilevel cell memory. The correction of the error in the memory cell having erroneous data in both bits of a bit pair is performed, for example, by a first correcting circuit of the multilevel cell memory. Constituting the second groups correspondingly to the first groups and identifying an error-occurring memory cell by using the second groups enables correction of an error in a memory cell, which has erroneous data in both bits of a bit pair, for each of the first groups, even with the multilevel memory cells each for storing more than two bits of data. That is, errors in the multilevel memory cells can be corrected by a simple method.

According to another aspect of the present invention, exclusive ORs of the first parity codes generated in the write operation and the first parity codes generated in the read operation are obtained for each of the first groups. Then, when the exclusive ORs of the bit pairs are all inverted from each other, it is detected that in the area allocated to the first group data read from the memory cells includes a single-bit error.

Next, either of bits of the bit pairs is assigned to respective digits of a binary number to determine a binary first address having an error. The error is corrected by inverting data corresponding to the binary first address among the data read from the memory cells. The detection and correction of a single-bit error are performed, for example, by a second detecting circuit and a second correcting circuit of the multilevel cell memory.

By dividing the multilevel memory cells into a plurality of bit pairs and assigning the individual bit pairs to each of the first groups, a single-bit error can be detected/corrected for each of the first groups even with the multilevel memory cells each for storing more than two bits of data. That is, errors in the multilevel memory cells can be detected/corrected by a simple method.

According to another aspect of the present invention, exclusive ORs of the first parity codes generated in the write operation and of the first parity codes generated in the read operation are obtained for each of the first groups. Then, when only one of the exclusive ORs is "1", it is detected that the first parity codes include a single-bit error. That is, even where the multilevel memory cells are divided into a plurality of bit pairs, an error in the first parity codes themselves can be detected for each of the first groups. The detection of an error in the first parity codes is performed, for example, by a third detecting circuit of the multilevel cell memory.

According to another aspect of the present invention, a parity memory circuit has a plurality of multilevel memory cells for storing the first parity codes, respectively. The first parity codes are simultaneously stored into a plurality of bits of the respective multilevel memory cells in the parity memory circuit. Consequently, even when bit errors occurs in the multilevel memory cells in the parity memory circuit, correct parity codes can be read by majority logic or the like.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 1 is an explanatory diagram showing a single-bit error occurring in a conventional flash memory;

FIG. 2 is an explanatory diagram showing an overview of conventional single-bit error detection/correction;

FIG. 6 is an explanatory diagram showing the combinations of binary cell addresses necessary for generating second parity codes according to the basic principle of the present invention;

FIG. 11 is an explanatory diagram showing an overview of single-bit error detection/correction using the first parity codes in the first embodiment;

FIG. 13 is an explanatory diagram showing an overview of the detection of a two-bit error in a single memory cell using the first parity codes in the first embodiment;

FIG. 14 is an explanatory diagram showing an overview of two-bit error correction using the second parity codes in the first embodiment;

FIG. 16 is an explanatory diagram showing an overview of the detection of a two-bit error across separate memory cells using the first parity codes in the first embodiment;

FIG. 20 is an explanatory diagram showing the correspondences among binary first addresses, physical bit addresses, and data according to the second basic principle of the present invention;

FIG. 21 is an explanatory diagram showing the combinations of binary first addresses and expressions necessary for generating first parity codes according to the second basic principle of the present invention;

FIG. 22 is an explanatory diagram showing the correspondences among binary second addresses, physical bit addresses, and data according to the second basic principle of the present invention;

FIG. 23 is an explanatory diagram showing the combinations of binary second addresses and expressions necessary for generating second parity codes according to the second basic principle of the present invention;

FIG. 28 is an explanatory diagram showing an overview of single-bit error detection/correction using the first parity codes in the third embodiment of the present invention;

FIG. 29 is an explanatory diagram showing an overview of two-bit error correction using the second parity codes in the third embodiment of the present invention.

DESCRIPTION OF THE PREFERRED EMBODIMENTS

Hereinafter, the principles and embodiments of the present invention will be described with reference to the drawings.

FIGS. 4–7 show the basic principles of the present invention.

A multilevel cell memory according to the present invention stores two bits of information in each single memory cell. In a single write operation, n/2 memory cells are accessed to write n bits of data. Likewise, in a single read operation, n/2 memory cells are accessed to read n bits of data. The individual bit areas to store data are identified by physical bit addresses PA of 0 to n−1. The memory cells are identified by physical cell addresses PCA of 0 to (n /2)−1.

This invention uses binary bit addresses BA for generating first parity codes for error detection, and binary cell addresses BCA for generating second parity codes for error correction. The binary bit addresses BA are assigned to correspond to the addresses that designate the individual bits of the memory cells (physical bit addresses PA). The binary cell addresses BCA are assigned to correspond to the memory cells. The first parity codes and second parity codes will be described in conjunction with FIGS. 5 and 6 to be seen later.

In the present invention, a pair of binary bit addresses BA respectively corresponding to a pair of physical bit address PA that designate each memory cell are assigned so as to be exclusive of each other. This invention is therefore characterized by that the binary bit addresses BA for generating first parity codes are provided aside from the physical bit addresses PA, and every two binary bit addresses BA corresponding to a single physical address PCA are set to have a sum of "111 . . . 1111" (1 in every digit).

Binary cell addresses BCA are binary representations of physical cell addresses PCA which designate individual memory cells. Write data WD0 to WDn−1 are written to memory cell areas corresponding to respective physical bit addresses PA. Read data RD0 to RDn−1 are read from these areas.

Figure 5:
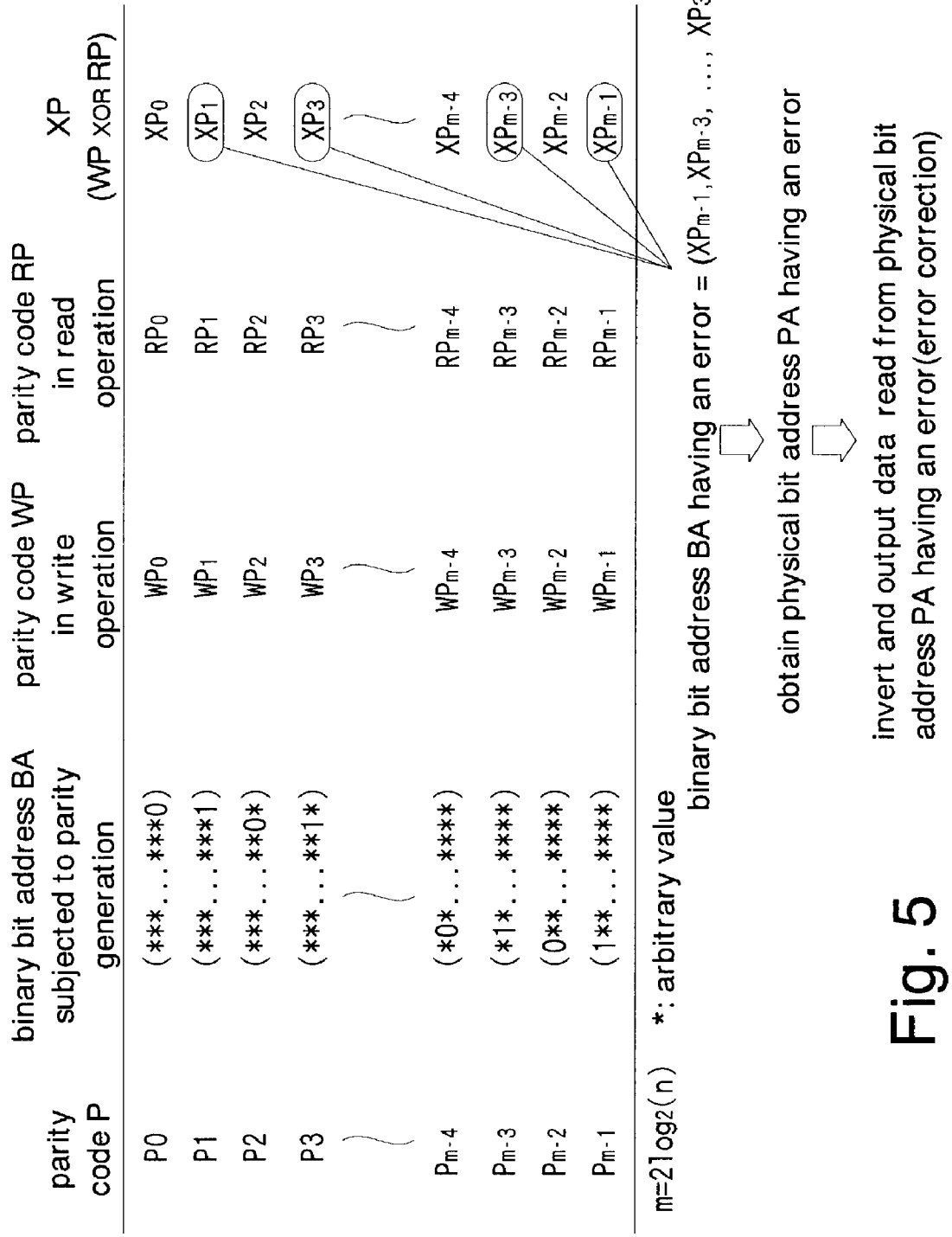
FIG. 5 is an explanatory diagram showing the combinations of binary bit addresses necessary for generating first parity codes according to the basic principle of the present invention.

FIG. 5 shows the combinations of binary bit addresses BA necessary for generating parity codes P0 to Pm−1 for error detection (first parity code). The parity codes P0 to Pm−1 are generated from the data corresponding to these binary bit addresses BA. The number m of parity codes P0 to Pm−1 is set at twice the number of bits of a binary bit address BA ($m = 2 \cdot \log_2(n)$).

The parity code P0 is calculated from the data corresponding to n/2 binary bit addresses BA that have "0" in their least significant digits. That is, the parity code P0 is generated from the data to be written/read under n/2 physical bit addresses PA corresponding to binary bit addresses "* ... *0" (* is an arbitrary value).

The parity code P1 is calculated from the data corresponding to n/2 binary bit addresses BA that have "1" in their least significant digits. That is, the parity code P1 is generated from the data to be written/read under n/2 physical bit addresses PA corresponding to binary bit addresses "* ... *1" (* is an arbitrary value).

Similarly, even-subscripted parity codes P2, P4, ..., Pm−2 are generated from the data corresponding to n/2 binary bit addresses BA having "0" in respective predetermined digits thereof. Odd-subscripted parity codes P3, P5, ..., Pm−1 are generated from the data corresponding to n/2 binary bit addresses BA having "1" in respective predetermined digits thereof.

Figure 4:
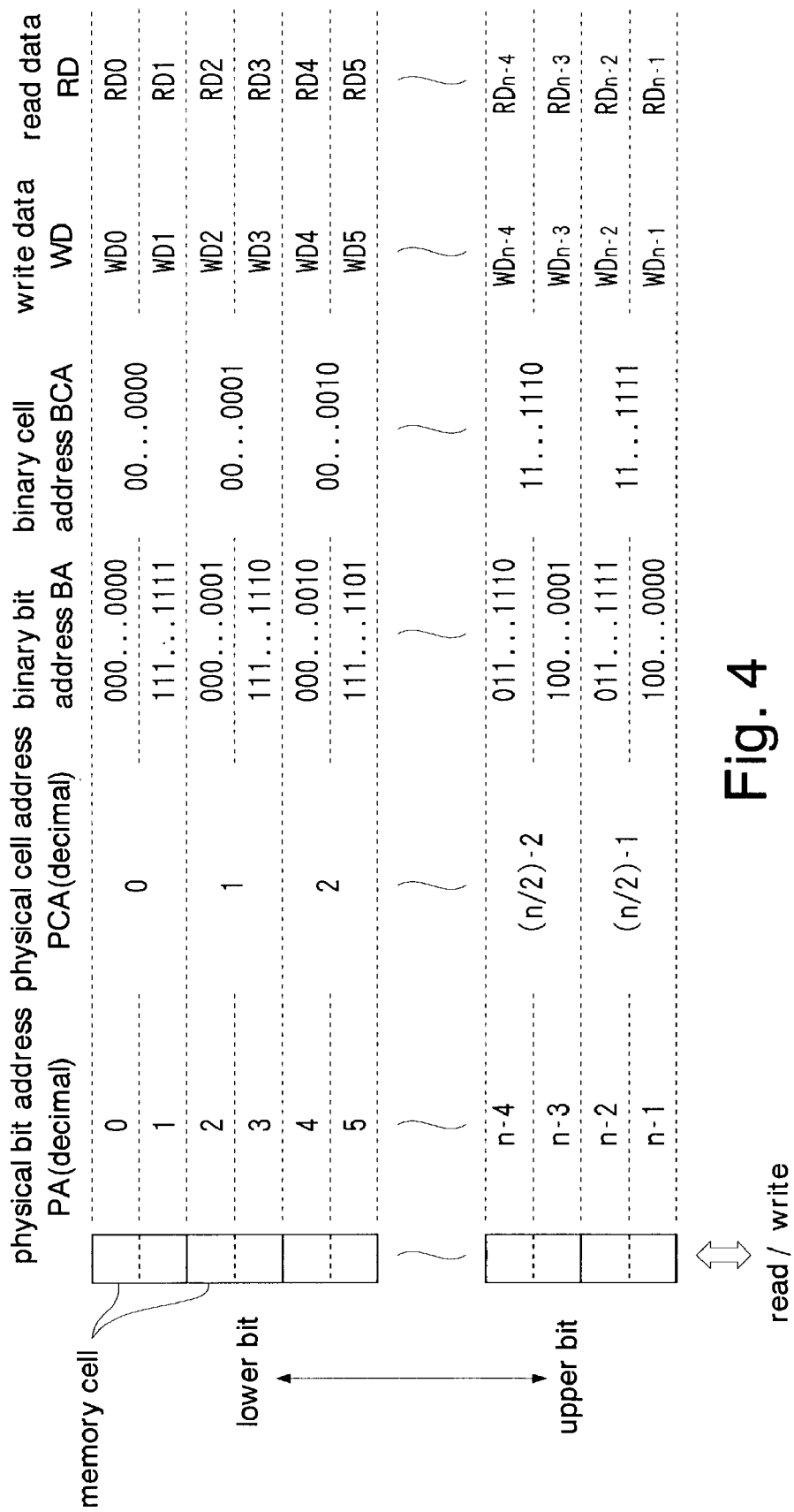
FIG. 4 is an explanatory diagram showing memory cell addressing according to the basic principles of the present invention.

Under the rules mentioned above, bits WP0 to WPm−1 of writing parity code WP (first parity code) are generated from respective predetermined n/2 bits out of the bits WD0 to WDn−1 of the n-bit write data WD shown in FIG. 4. The parity code WP is written to a predetermined memory area along with the n-bit write data WD0 to WDn−1.

Similarly, bits RP0 to RPm−1 of reading parity code RP (first parity code) are generated from respective predetermined n/2 bits out of the bits RD0 to RDn−1 of n-bit read data RD. The parity code RP is generated at the time of reading n bits of data. Hereinafter, the parity codes WP and RP will be also referred to simply as parities WP and RP.

Now, description will be given of the method for error detection/correction in the present invention.

Initially, in a read operation, a parity WP is read out along with read data RD. From the bits WP0 to WPm−1 of the parity WP and the bits RP0 to RPm−1 of a parity RP that is generated from the read data RD, respective exclusive ORs XP0 to XPm−1 (WP XOR RP) are obtained. Then, the exclusive ORs XP0 to XPm−1 are used to perform error detection in the manner to be described below.

(a) When the parities WP and RP are equal in each bit, i.e., when all the bits of the exclusive OR XP are "0", there occurs no error.

(b) When comparisons between the bits of the parities WP and RP show that either one of the parity codes P0 and P1, either one of the parity codes P0 and P3, ..., and either one of the parities Pm−2 and Pm−1 are all inverted, there occurs a single-bit error. In other words, when the exclusive ORs of the parities WP and RP are obtained to find that all the pairs of exclusive ORs corresponding to each digit of the binary bit addresses BA concerned at generating the parities WP and RP, respectively, are inverted from each other, a single-bit error is detected. The condition for the single-bit error detection may be expressed by the following equation (1). That is, given an integer k, a single-bit error is detected when adjoining even- and odd-numbered exclusive ORs differ from each other.

$$(XP2k) XOR (XP2k+1) = 1 \quad (1)$$

(integer $k=0$ to $((m/2)−1)$, $m=2 \cdot \log_2(n)$)

Here, the error-occurring binary bit address BA (error bit address) is obtained by arranging the values of either of the pairs of exclusive ORs to respective digits of the address. In this example, the odd-subscripted exclusive ORs are arranged in descending order to obtain the value. Specifically, the digits of the error bit address are XPm−1, XPm−3, ..., XP5, XP3, and XP1 in descending order. Then, the data read from the error bit address is inverted for error correction.

(c) If all the exclusive ORs XP0 to XPm−1 are "1", a two-bit error occurring in a single memory cell is detected. That is, when the individual bits of the parity WP differ from the individual bits of the parity RP, a two-bit error occurring in a single memory cell is detected. The reason for this is that each pair of binary bit addresses BA corresponding to two bits to be stored into the same memory cell are combined so as to be mutually inverted in every bit.

FIG. 6 shows the combinations of binary bit addresses BCA necessary to generate parity codes CP0 to CPj−1 (second parity code) for correcting a two-bit error occurring in a single memory cell. The parity codes CP0 to CPm−1 are generated from the data corresponding to these binary bit addresses BCA. The parity codes CP0 to CPj−1 are used only to correct a two-bit error in the same memory cell (error of a single memory cell). Thus, in contrast to the generation of the parity codes P0 to Pm−1 described above, the number of parity codes CP0 to CPj−1 to be generated is small. Specifically, the number j of parity codes CP0 to CPj−1 is a half of the number of bits of a binary bit address BA (physical bit address PA), or $j = \log_2(n/2)$. That is, the number j of parity codes CP0 to CPj−1 is the same as the number of bits of a binary cell address BCA.

The parity code CP0 is generated from either of the pairs of data corresponding to n/4 binary cell addresses BCA that have "1" in their least significant digits. That is, the parity code CP0 is generated from, for example, the pieces of data corresponding to odd-numbered physical bit addresses PA out of the pairs of physical bit addresses PA corresponding to binary cell addresses "* ... *1" (* is an arbitrary value).

The parity code CP1 is generated from either of the pairs of data corresponding to n/4 binary cell addresses BCA that have "1" in their second digits. That is, the parity code CP1 is generated from, for example, the pieces of data corresponding to odd-numbered physical bit addresses PA out of the pairs of physical bit addresses PA corresponding to binary cell addresses "* ... 1*" (* is an arbitrary value).

Similarly, the parity codes CP0 to CPj−1 are generated from either of the pairs of data corresponding to n/4 binary cell addresses BCA that have "1" in respective predetermined digits. That is, the parity codes CP0 to CPj−1 are generated from the data-to be written to either of bits of the memory cells corresponding to all binary cell addresses BCA that have "0" or "1" in respective predetermined digits thereof. In this example, either of bits of the memory cells are the bits corresponding to odd-numbered physical bit addresses PA. The parity codes CP0 to CPj−1 may be generated with the bits corresponding to even-numbered physical bit addresses PA as either of the bits of the memory cells.

Parity codes WCP0 to WCPj−1 are the parity codes CP0 to CPj−1 generated in a write operation. Under the rules mentioned above, the bits WCP0 to WCPj−1 of writing parity code WCP (second parity code) are generated from respective predetermined n/4 bits out of the bits WD0 to WDn−1 of the n-bit write data WD shown in FIG. 4. The parity code WCP is written to a predetermined memory area along with the n-bit write data WD and the parity code WP mentioned above.

Similarly, parity codes RCP0 to RCPj−1 are the parity codes CP0 to CPj−1 generated in a read operation. The bits RCP0 to RCPm−1 of reading parity code RCP (second parity code) are generated from respective predetermined n/4 bits out of the bits RD0 to RDn−1 of n-bit read data RD. The parity code RCP is generated with the parity code RP, at the time of reading the read data RD. Hereinafter, the parity codes WCP and RCP will be also referred to simply as parities WCP and RCP.

Then, in a read operation, exclusive ORs XRP0 to XRPj−1 are obtained from the individual bits WCP0 to WCPj−1 of the parity WCP, read with the read data RD and the parity WP, and the individual bits RCP0 to RCPj−1 of the parity RCP, generated from the read data RD (WCP XOR RCP).

The binary cell address BCA under which the two-bit error occurs is determined by arranging the values of the exclusive ORs XRP0 to XRPj−1 to respective digits of the address. Specifically, the digits of the binary cell address BCA are XRPj−1, XRPj−2, . . . , XRP1, and XRP0 in descending order. Then, this binary cell address BCA determines the error-occurring physical cell address PCA, and the two error-occurring physical bit addresses PA. Inverting the bit data of the read data RD corresponding to the physical bit address PA corrects the two-bit error in a single memory cell.(d) If the exclusive ORs XP0 to XPm−1 shown in FIG. 5 have a bit pattern that does not apply to any of no error, a single-bit error, or a two-bit error in a single memory cell, it follows that the occurrence of a more-than-one-bit error across two or more memory cells or the occurrence of a one-or-more-bit error in a parity-containing memory cell is detected.

Figure 7:
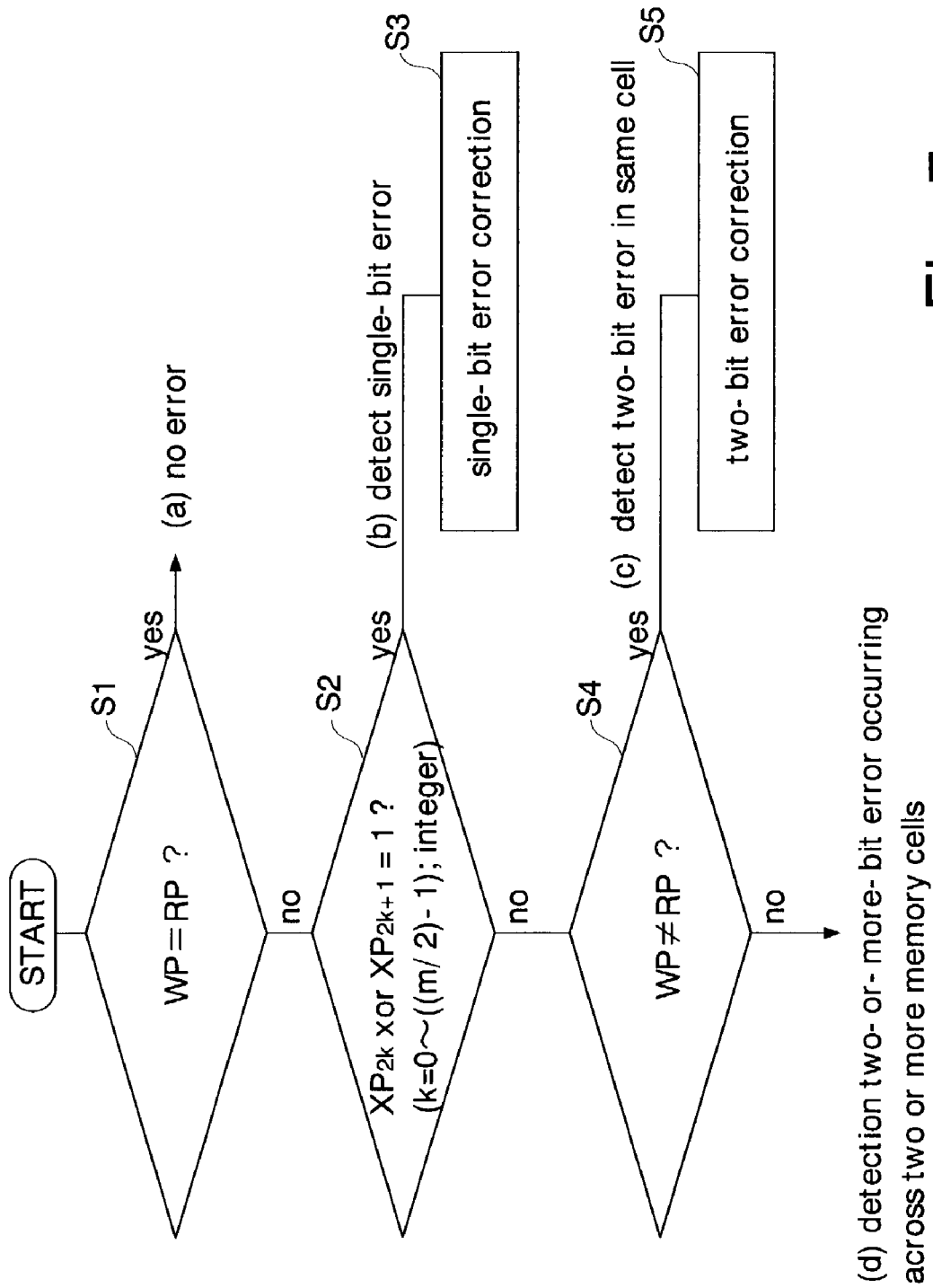
FIG. 7 is a flowchart showing a method for error detection/correction according to the basic principles of the present invention.

FIG. 7 shows the flow for the error detection/correction to be performed by the multilevel cell memory described above. The symbols (a) to (d) in the flow correspond to the descriptions (a) to (d) above. This flow is executed during data read operations.

Initially, at step S1, whether the write parity WP and the read parity RP are equal or not is determined. If the write parity WP and the read parity RP are equal, or all the exclusive ORs XP0 to XPm−1 shown in FIG. 5 are "0", then a determination of no error is given. Here, the data read from the memory cells is simply output to exterior. If the write parity WP and the read parity RP are different from each other, the processing moves to step S2.

At step S2, whether or not the above-mentioned equation (1) holds for an integer k (k=0 to ((m/2)−1)) is determined. If the equation (1) holds, a single-bit error is detected so that the processing moves to step S3. If the equation (1) does not hold, the processing moves to step S4.

At step S3, single-bit error correction is performed as described in FIG. 5. That is, the data read from the memory cells is corrected for the single bit, and output to exterior.

At step S4, whether or not the write parity WP and the read parity RP are completely different from each other is determined. If the write parity WP and the read parity RP are completely different from each other, or all the exclusive ORs XP0 to XPm−1 are "1", then a two-bit error is detected in a single memory cell so that the processing moves to step S5. If the write parity WP and the read parity RP have none of the difference patterns of steps S1, S2, and S4, then a two-or-more-bit error across two or more memory cells or a one-or-more-bit error in a parity-containing memory cell is detected.

At step S5, a two-bit error occurring in a single memory cell is corrected as described in FIG. 6. That is, the data read from the memory cells is corrected for the two bits, and output to exterior.

Figure 8:
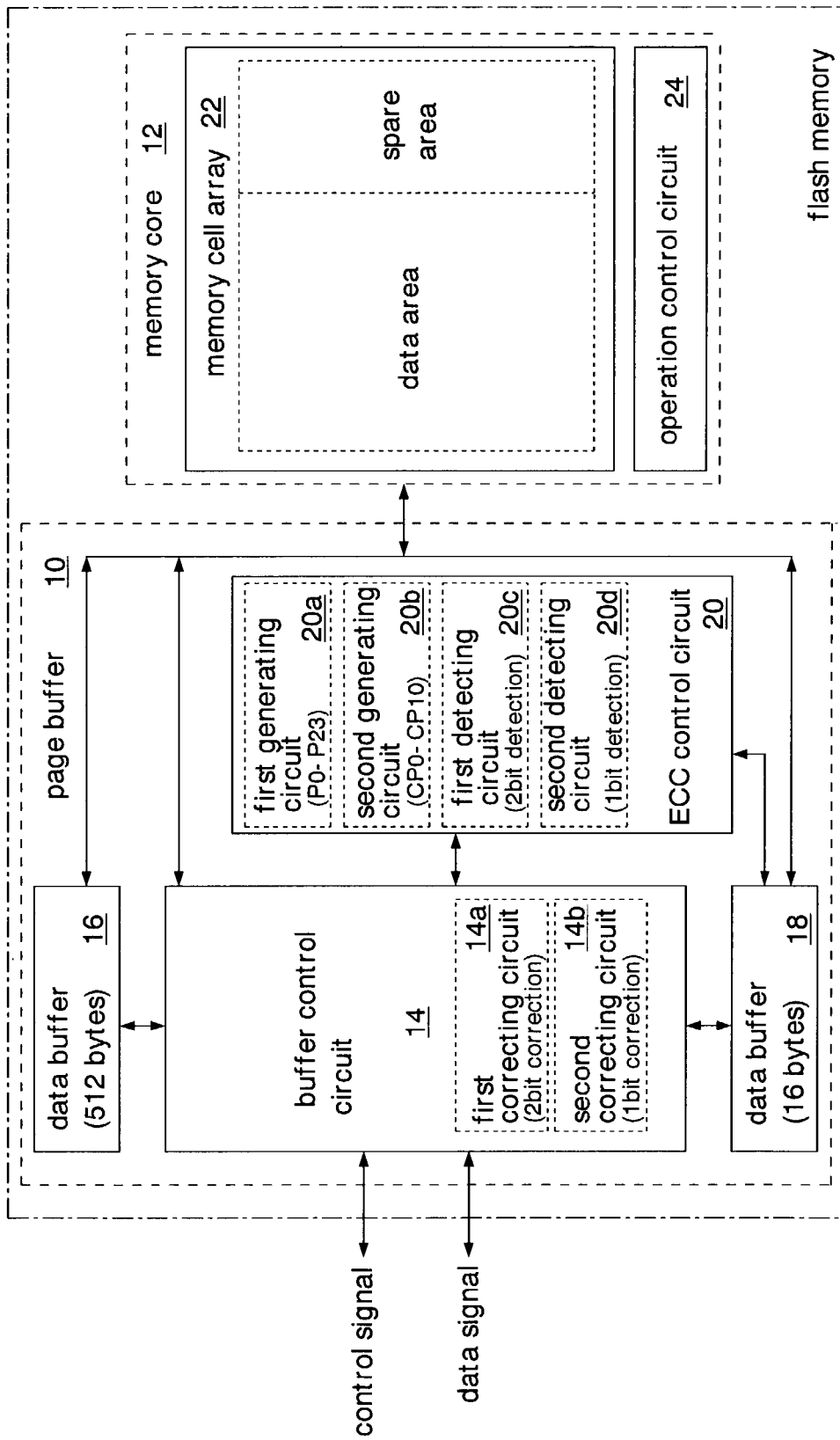
FIG. 8 is a block diagram showing a first embodiment of the present invention.

FIG. 8 shows a first embodiment of the present invention. The multilevel cell memory is formed as a floating gate type four-level cell flash memory capable of storing two bits of information in each single memory cell. In this flash memory, the amounts of carriers to be trapped in the floating gates of memory cells are adjusted in four levels according to write data. Then, four types of memory cell currents corresponding to the threshold voltages of the memory cells are detected to read two bits of data stored in the memory cells.

The flash memory has a page buffer 10 and a memory core 12, as well as not-shown input circuits, output circuits, control circuits, and the like. The page buffer 10 has a buffer control circuit 14, data buffers 16 and 18, and an ECC control circuit 20. The memory core 12 includes a memory cell array 22 which is composed of a data area and a spare area, including a plurality of pages, and an operation control circuit 24 which performs read operations, write operations (programming operations), and erase operations. Read operations and write operations are performed page by page. Erase operations are performed page by page or in steps of a plurality of pages.

Figure 9:
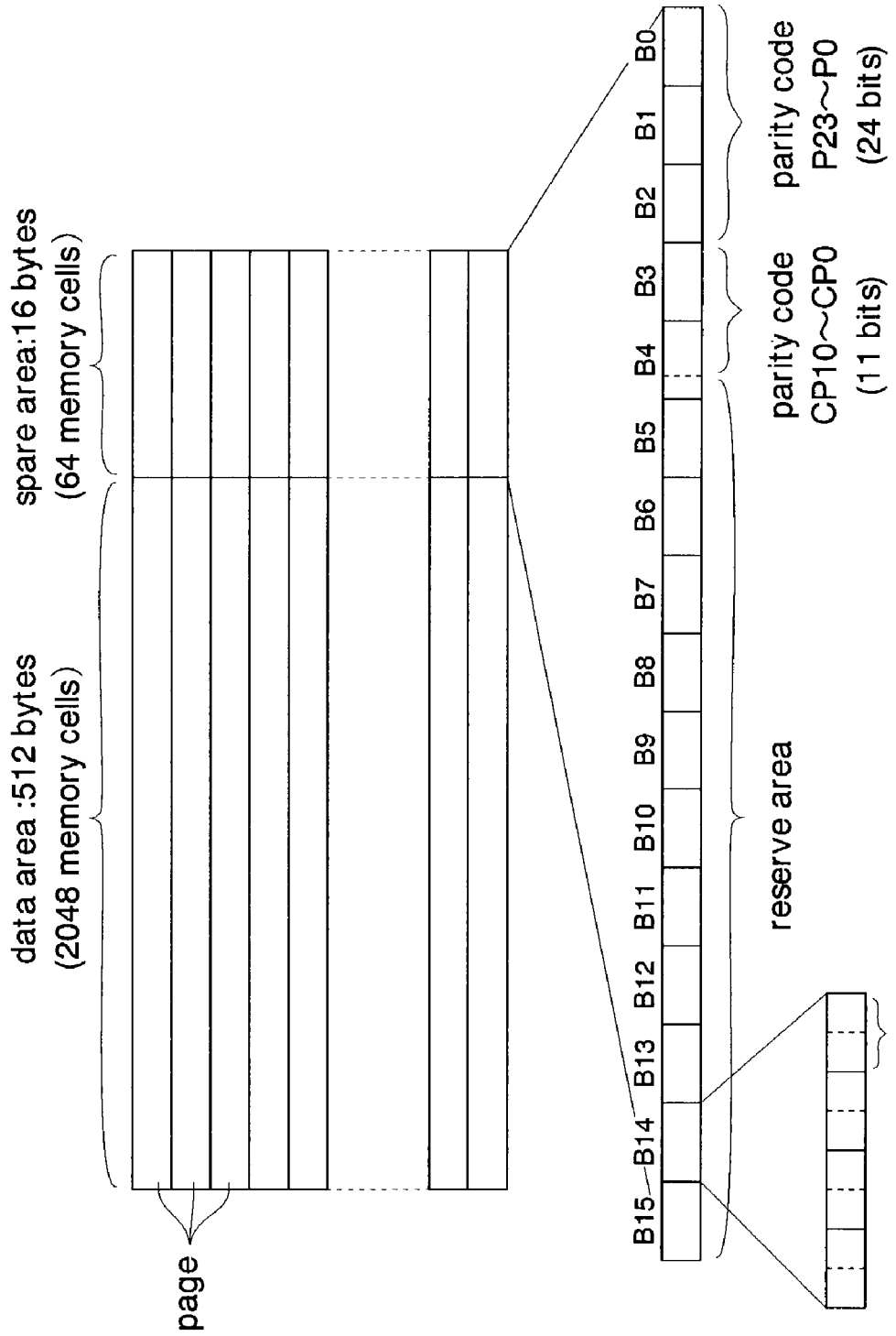
FIG. 9 is an explanatory diagram showing the details of the memory cell array of FIG. 8.

FIG. 9 shows the details of the memory cell array 22 shown in FIG. 8. Each page of the memory cell array 22 consists of 512 bytes (4096 bits=n) of data area and 16 bytes (128 bits) of spare area. Since each single memory cell can store two bits of data, a single page of data area contains 2048 memory cells. A single page of spare area contains 64 memory cells. The relationship between data to be stored into memory cells and the threshold voltage is the same as that of FIG. 2 described above. That is, the memory cells have four types of threshold voltages divided by the reference voltages V1, V2 and V3. Logical data of "00", "01", "10", and "11" are assigned to the threshold voltages in ascending order.

In each page of spare area, the lower 35 bits are allocated to an area for storing 24 bits of parity code P0–P23 (first parity code) and 11 bits of parity code CP0–CP10 (second parity code). The remainder of the spare area are allocated for reserve areas.

The buffer control circuit 14 shown in FIG. 8 has a first correcting circuit 14a for correcting a two-bit error occurring in a single memory cell on the basis of the parities CP0–CP10, and a second correcting circuit 14b for correcting a single-bit error on the basis of the parities P0–P23. The buffer control circuit 14 controls the data buffers 16, 18 and the ECC control circuit 20 in accordance with control signals from exterior.

The data buffer 16 is a buffer for reading/writing data signals from/to predetermined pages of data area in the memory cell array 22, with a capacity of 512 bytes. In this flash memory, a data signal consists of eight bits. Therefore, a single byte of data signal is input 512 times to input 512 bytes of data signals to the data buffer 16. The data buffer 18 is a buffer for reading/writing data signals from/to predetermined pages of spare area in the memory cell array 22, with a capacity of 16 bytes.

The ECC control circuit 20 has a first generating circuit 20a for generating the parities P0–P23, a second generating circuit for generating the parities CP0–CP10, a first detecting circuit 20c for detecting a two-bit error occurring in a single memory cell on the basis of the parities CP0–CP10, and a second detecting circuit 20d for detecting a single-bit error on the basis of the parities P0–P23. The ECC control circuit 20 performs the generation of the parity codes and the detection of errors described in FIGS. 4–7.

In write operations, the buffer control circuit 14 writes 512 bytes of write data (data signals) successively supplied from exterior, into specified pages in the data area through the data buffer 16. Here, the first generating circuit 20a and the second generating circuit 20b in the ECC control circuit 20 generate parities WP0–WP23 and parities WCP0–WCP10, respectively, from write data transferred from the buffer control circuit 14, and output the generated parities to the data buffer 18. The buffer control circuit 14 writes the parities WP0–WP23 and WCP0–WCP10, transferred to the data buffer, into specified pages in the spare area.

In read operations, the buffer control circuit 14 reads data and parity codes from specified pages of the data area and spare area, respectively, and temporarily holds the same in the data buffers 16 and 18, respectively. Here, the first generating circuit 20a and the second generating circuit 20b in the ECC control circuit 20 generate parities RP0–RP23 and parities RCP0–RCP10, respectively, from the 512 bytes of data read from the data area.

The first detecting circuit 20c and the second detecting circuit 20d of the ECC control circuit 20 calculate the exclusive ORs XP0–XP23 of the parities WP0–WP23 read from the spare area and the parities RP0–RP23 generated by the first generating circuit 20a. As has been discussed in the basic principles above, the exclusive ORs XP0–XP23 are used to detect no error, a single-bit error, a two-bit error occurring in a single memory cell, a two-or-more-bit error occurring across two or more memory cells, or a one-or-more-bit error in a parity-containing memory cell. Incidentally, the first detecting circuit 20c and the second detecting circuit 20d may be composed of the same circuit.

If no error is detected, the ECC control circuit 20 informs the buffer control circuit 14 of the detection of no error. The buffer control circuit 14 simply outputs the 512 bytes of read data held in the buffer 16 to exterior.

If a single-bit error is detected by the second detecting circuit 20d, the ECC control circuit 20 transmits the error-occurring physical bit address PA (error bit address) to the buffer control circuit 14. The second correcting circuit 14b in the buffer control circuit 14 inverts the data corresponding to the error bit address among the 512 bytes of read data held in the buffer 16. Then, the error-corrected, 512 bytes of read data are output to exterior.

If a two-bit error occurring in a single memory cell is detected, the first detecting circuit 20c calculates the error-occurring binary cell address BCA (binary cell address having an error) from the parities RCP0–RCP10 as described in FIG. 6. The first detecting circuit 20c determines two consecutive physical bit addresses PA (error bit addresses) from the binary cell address BCA calculated, and transmits the physical bit addresses PA calculated to the buffer control circuit 14. The first correcting circuit 14a in the buffer control circuit 14 inverts the data corresponding to the error bit addresses among the 512 bytes of read data held in the buffer 16. Then, the error-corrected, 512 bytes of read data are output to exterior.

If a two-or-more-bit error occurring across two or more memory cells, or a one-or-more-bit error in a parity-containing memory cell is detected, the ECC control circuit 20 informs the buffer control circuit 14 of the occurrence of an uncorrectable error. The buffer control circuit 14 outputs the occurrence of an uncorrectable error to exterior in the form of a control signal. Then, for example, the system implementing the flash memory subsequently quits using the error-occurring page, or retries the read operation to the same page.

Next, the correction/detection of a single-bit error, the correction/detection of a two-bit error occurring in a single memory cell, and the detection of a two-or-more-bit error occurring across two or more memory cells (or a one-or-more-bit error in a parity-containing memory cell),mentioned above will be described in specific figures. For simplicity, the following description deals with the case of accessing (writing/reading) memory cells in steps of eight bits as in FIG. 1 described above. In this example, odd parity codes are used.

Figure 10:
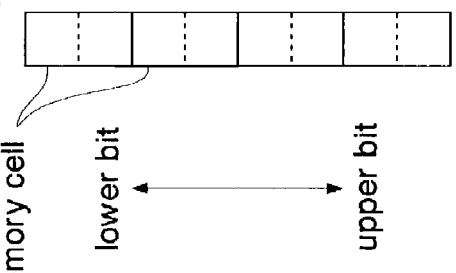
FIG. 10 is an explanatory diagram showing a single-bit error occurring in the first embodiment.

FIGS. 10 and 11 show the method for detecting and correcting a single-bit error. As in FIG. 1, write data WD of "10010110" in binary is written to memory cells, and read data RD of "10010010" in binary is read from the memory cells. That is, a single-bit error occurs in the memory cell having a physical bit address PA of "2".

As shown in FIG. 11, the first generating circuit 20 a shown in FIG. 8 initially generates parity codes P0–P5 from data corresponding to binary bit addresses BA having "0" or "1" in respective digits. The second detecting circuit 20d obtains the exclusive ORs of the even-subscripted exclusive ORs (XP0, for example) and the adjoining odd-subscripted exclusive ORs (XP1, for example), respectively. A single-bit error is detected on the basis that all of these exclusive ORs are "1". The second detecting circuit 20d obtains the error-occurring binary bit address BA ("001") from the odd-subscripted parity codes XP5, XP3, and XP1. Besides, from the binary bit address BA obtained, the second detecting circuit 20d determines the physical bit address PA ("2") under which the single-bit error occurs. After this, the second correcting circuit 14b in the buffer control circuit 14 inverts the data read from the physical bit address PA. That is, the single-bit error is corrected.

Figure 12:
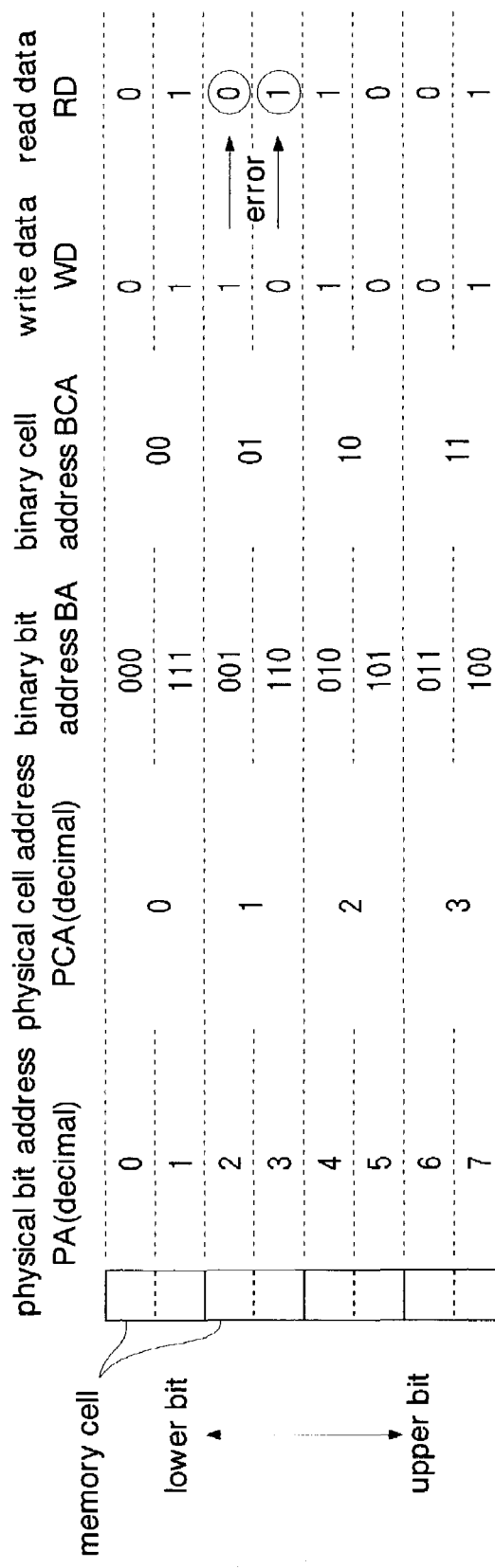
FIG. 12 is an explanatory diagram showing a two-bit error occurring in a single memory cell in the first embodiment.

FIGS. 12–14 show the method for detecting and correcting a two-bit error occurring in a single memory cell. In this example, write data WD of "10010110" in binary is written to memory cells, and read data RD of "10011010" in binary is read from the memory cells. That is, a two-bit error occurs in the memory cell having physical bit addresses PA of "2" and "3" (physical cell address PCA="1").

As shown in FIG. 13, the first generating circuit 20a shown in FIG. 8 initially generates the parity codes P0–P5 from data corresponding to binary bit addresses BA having "0" or "1" in respective digits. The first detecting circuit 20c detects a two-bit error occurring in a single memory cell on the basis that all the exclusive ORs XP are "1".

Next, as shown in FIG. 14, the second detecting circuit 20d obtains the error-occurring binary cell address BCA ("01") from the exclusive ORs XRP which are obtained from the parity codes WCP and RCP. Moreover, from the binary bit address BCA obtained, the second detecting circuit 20d determines the physical cell address PCA (="1") and the physical bit addresses PA (="2", "3"). After this, the first correcting circuit 14a of the buffer control circuit 14 shown in FIG. 8 inverts the data read from the physical bit addresses PA. That is, the two-bit error occurring in a single memory cell is corrected.

Figure 15:
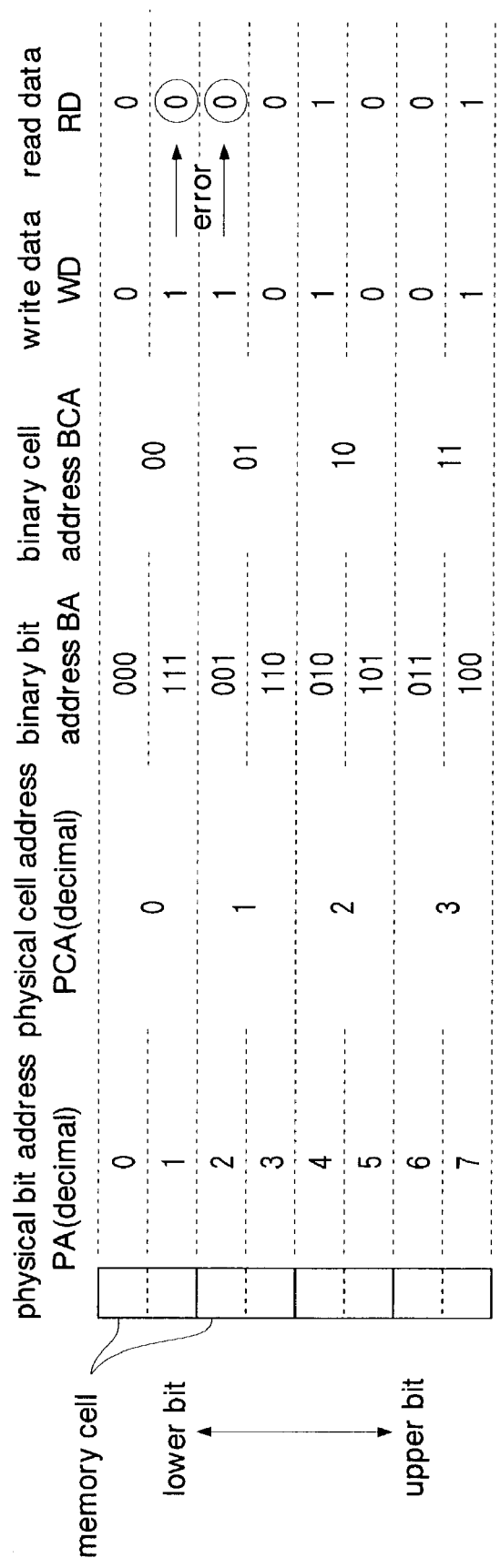
FIG. 15 is an explanatory diagram showing a two-bit error occurring across separate memory cells in the first embodiment.

FIGS. 15 and 16 show the method of detecting a two-or-more-bit error occurring across two or more memory cells, or a one-or-more-bit error in a parity-containing memory cell. In this example, write data WD of "10010110" in binary is written to memory cells, and read data RD of "10010000" in binary is read from the memory cells. That is, a two-bit error occurs across the memory cells having physical bit addresses PA of "1" and "2" (a two-bit error across the physical cell addresses PCA of "0" and "1").

As shown in FIG. 16, the first generating circuit 20a initially generates the parity codes P0–P5 from data corresponding to binary bit addresses BA having "0" or "1" in respective digits. The ECC control circuit 20 detects a two-or-more-bit error occurring across two or more memory cells or a one-or-more-bit error in a parity-containing memory cell, on the basis that the exclusive ORs XP have none of the patterns expected in advance.

As has been described, in the present embodiment, binary bit addresses BA are assigned to each memory cell in such a combination that they are mutually inverted in every bit. As a result, a two-bit error occurring in a single memory cell can be easily detected by the first generating circuit 20a and first detecting circuit 20c of simple configuration. Therefore, the four-level cell semiconductor memory can perform reliable error detection/correction by a simple method.

Since the parity codes CP0–CP10 are generated from the data selected on the basis of cell addresses, the second generating circuit 20b can be formed in a simple configuration. That is, a two-bit error in a single memory cell can be corrected by a simple circuit. Since the first and second detecting circuits 20c and 20d of simple configuration can correct errors, the four-level cell flash memory is prevented from increasing in chip size.

The detection/correction of a single-bit error is performed by utilizing the parity codes P0–P23 which are used to detect a two-bit error in a single memory cell. Therefore, the function of detecting/correcting a single-bit error can be added without increasing the scale of the error detecting/correcting circuit. That is, the multilevel cell memory is prevented from an increase in chip size.

Figure 17:
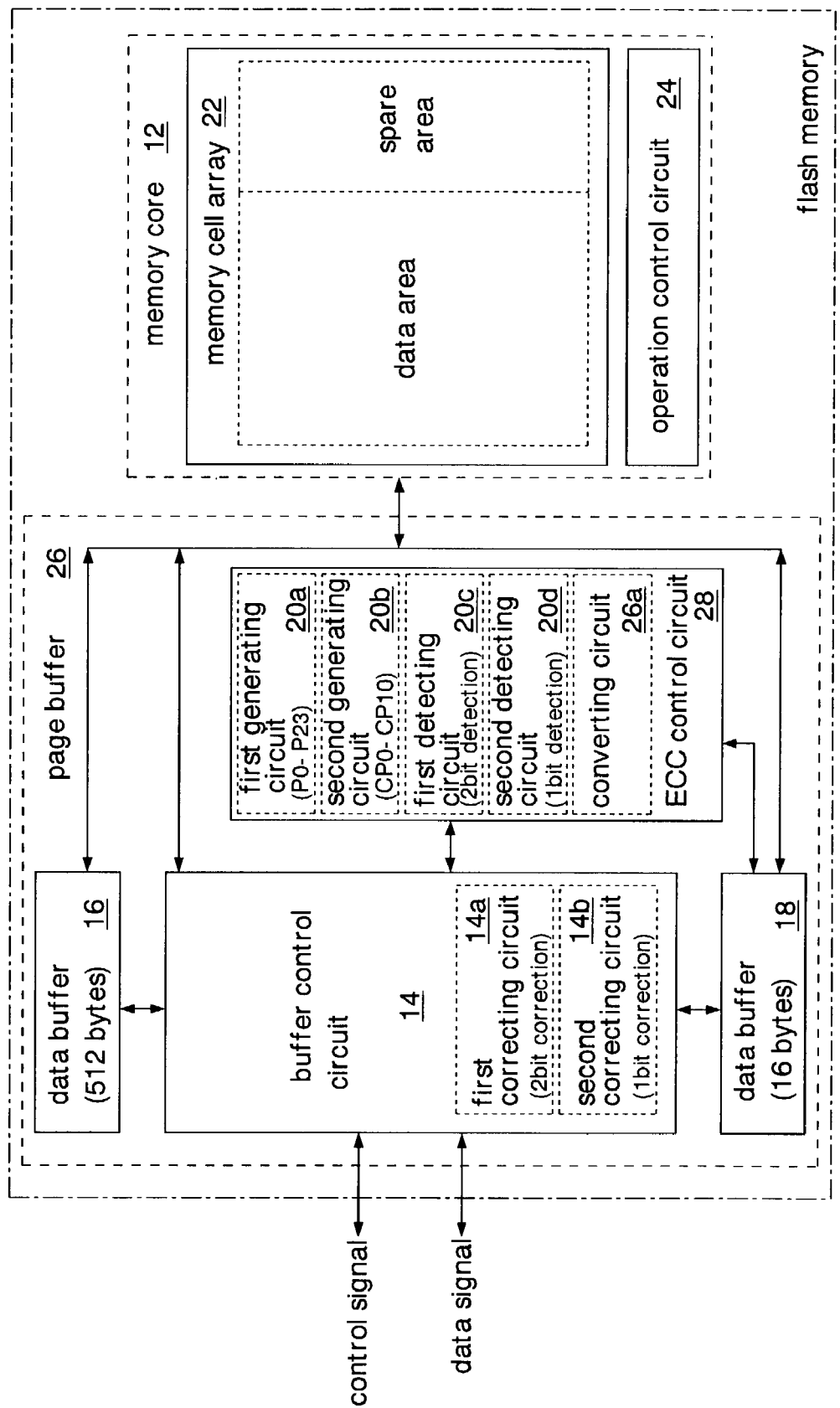
FIG. 17 is a block diagram showing a second embodiment of the present invention.

FIG. 17 shows a second embodiment of the multilevel cell memory in the present invention. The same elements as those described in the first embodiment will be designated by identical reference numbers. Detailed description thereof will be omitted.

The multilevel cell memory in this embodiment is formed as a floating gate type flash memory capable of storing two bits of information in each single memory cell. The flash memory includes a page buffer 26 having an ECC control circuit 28, instead of the page buffer 10 of the first embodiment having the ECC control circuit 20. The ECC control circuit 28 contains a converting circuit 26a, aside from the same first generating circuit 20a, second generating circuit 20b, first detecting circuit 20c, and second detecting circuit 20d as those of the first embodiment. The other circuits of the page buffer 26 and the memory core 12 have the same configurations as those of the first embodiment.

Figure 18:
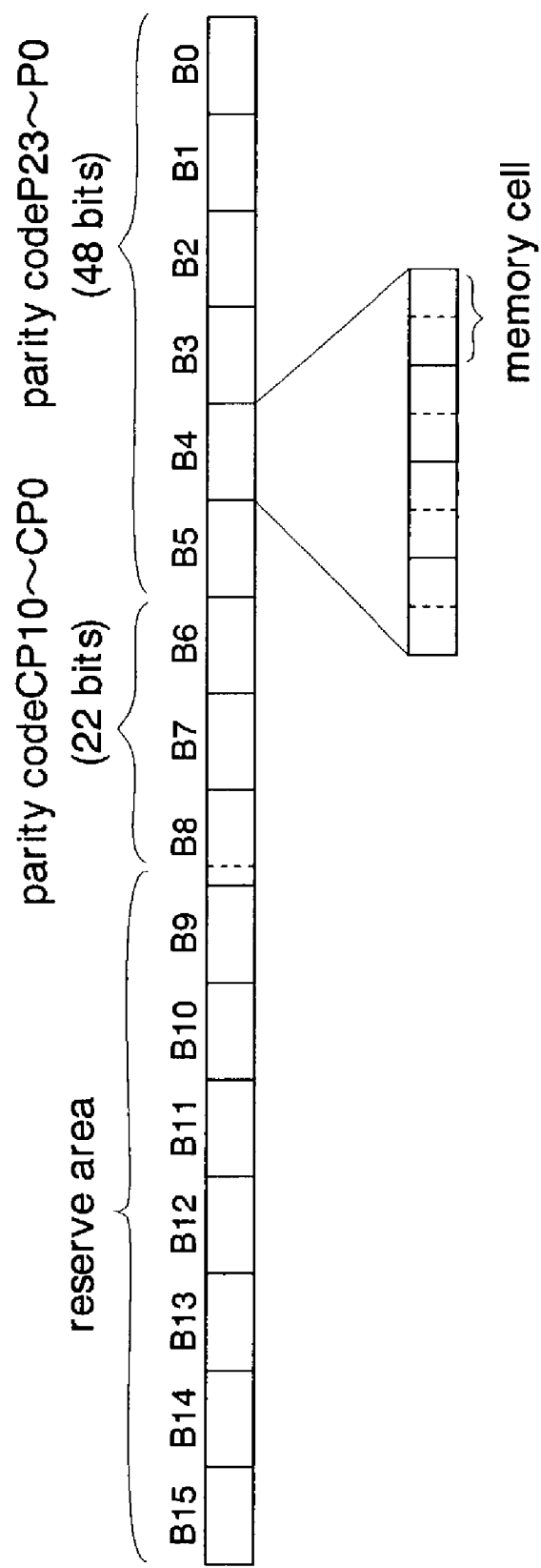
FIG. 18 is an explanatory diagram showing the details of the spare area in the second embodiment.

FIG. 18 shows the details of the spare area in the memory cell array 22 shown in FIG. 17. This embodiment uses 48 bits and 22 bits of spare areas to store 24 bits of parity code WP0–WP23 and 11 bits of parity code WCP0–WCP10, respectively.

Figure 3:
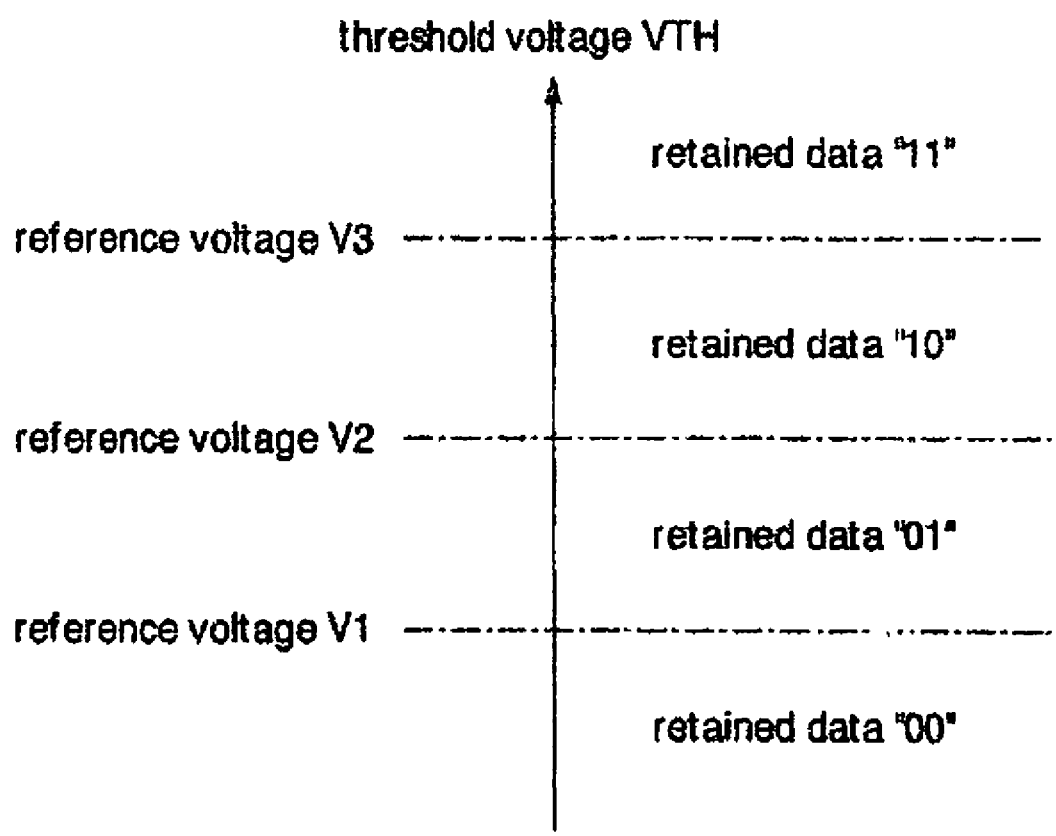
FIG. 3 is an explanatory diagram showing the relationship between logical values of data and threshold voltage VTH in a conventional flash memory that can store two bits of information in each single memory cell.

For example, given that the relationship between data to be stored in memory cells and the threshold voltage is the same as in FIG. 3 described above, the converting circuit 26a shown in FIG. 17 converts logical values of parity codes of "0" and "1" into logical values of "00" and "11", respectively. That is, the converting circuit 26a converts the logical value of a parity code from a single bit to two bits. In this way, the logical values of parity codes can be converted into the logical values corresponding to the extreme threshold voltages shown in FIG. 3, to lower the probability of occurrence of parity code errors. That is, these parity codes to be stored into the spare areas improve in reliability.

This embodiment can offer the same effects as those obtained from the first embodiment described above. Besides, in this embodiment, each bit of the parity codes WP0 to WPm−1 and parity codes WCP0 to WCPj−1 is stored by using two bits of memory cell. This allows an improvement in the reliability of the parity codes. Consequently, the error detection and error correction can be performed without fault.

Note that the embodiments described above have dealt with the cases where logical data of "00", "01", "10", and "11" are assigned in the ascending order of the threshold voltages in the memory cells. However, the present invention is not limited to such embodiments. For example, logical data of "00", "01", "11", and "10" may be assigned in the ascending order of the threshold values. In this case, two-bit errors will not occur even if the value of the threshold voltage of a memory cell changes to that of an adjoining area. This allows a reduction in the probability of occurrence of two-bit errors.

The embodiments described above have dealt with the cases where odd parities are used for error detection/correction. However, the present invention is not limited to such embodiments. For example, the error detection/correction may be performed by using even parities.

The above-described embodiments have dealt with the cases where the present invention is applied to a multilevel cell flash memory. However, the present invention is not limited to such embodiments. For example, the present invention may be applied to multilevel cell ferroelectric memories. Moreover, the present invention may be applied to other non-volatile semiconductor memories and volatile-semiconductor memories which can store more than one bit.

The first embodiment described above has dealt with the case where the parity codes CP0–CP10 are generated from sets of binary cell addresses BCA that have "1" in respective digits. However, the present invention is not limited to such an embodiment. For example, the parity codes CP0–CP10 may be generated from sets of binary cell addresses BCA that have "0" in respective digits.

FIGS. 19–25 show a second basic principle of the present invention.

A multilevel cell memory according to this basic principle stores m bits (even number) of data in each single memory cell. In a single write operation, n/m memory cells are accessed and n bits of data are written thereto. Likewise, in a single read operation, n/m memory cells are accessed and n bits of data are read therefrom. The bit areas each for storing a single bit of data are identified by physical bit addresses PA of 0 to n−1.

In this basic principle, two bits (a bit pair) are selected from each memory cell to constitute m/2 first groups A1, A2, . . . , A(m/2). For example, the lowest two bits of memory cells are assigned to the first group A1. The highest two bits of the memory cells are assigned to the first group A(m/2). The configuration of the first groups A1, A2, . . . , A(m/2) is not limited to the one shown in FIG. 19. It is essential only that all the bits of the individual memory cells are assigned, in units of two bits, to any of the first groups A1, A2, . . . , A(m/2).

In the first groups A1, A2, ..., A(m/2), two binary first addresses BA1 that designate each bit pair in a single memory cell are assigned so as to be different from each other in every bit address digit. The binary first addresses BA1 are used to generate first parity codes PC1 for error detection to be described in conjunction with FIG. 21.

Moreover, either of bits of the bit pairs in the first groups A1, A2, ..., A(m/2) are selected to constitute second groups B1, B2, ..., B(m/2) respectively corresponding to the first groups A1, A2, ... A(m/2). In this example, the even-numbered bits of the bit pairs in the first groups A1, A2, ..., A(m/2) are assigned to the respective second groups B1, B2, ... B(m/2). The either of bits to be selected may be the odd-numbered bits of the first groups A1, A2, ... A(m/2).

In each of the second groups B1, B2, ..., B(m/2), binary second addresses BA2 designating the respective bits are assigned in succession so as to avoid redundancies. The binary second addresses BA2 are used to generate second parity codes PC2 for error correction to be described in conjunction with FIG. 23.

Figure 19:
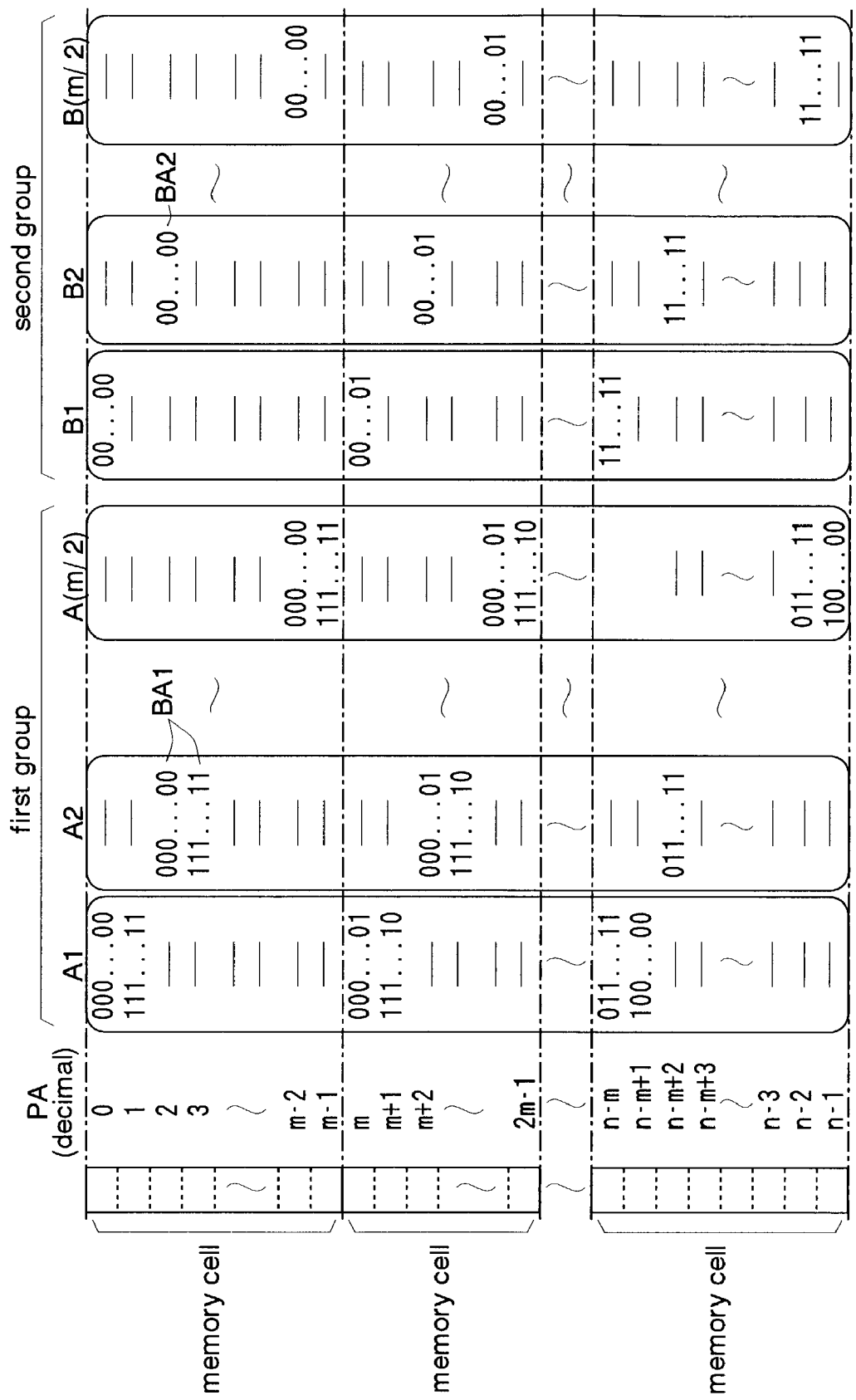
FIG. 19 is an explanatory diagram showing memory cell addressing according to a second basic principle of the present invention.

FIG. 20 shows the correspondences among binary first addresses BA1, physical bit addresses PA, and data D to be stored in the respective bits when the first group A1 shown in FIG. 19 is sorted in order of the binary first addresses BA1.

FIG. 21 shows the combinations of binary first addresses BA1 and the expressions necessary for generating the first parity codes PC1 (L0A1, L1A1, ..., L($\log_2(2n/m)-1$)A1, H0A1, H1A1, ..., H($\log_2(2n/m)-1$)A1) for error detection in the first group A1. The first parity codes PC1 are generated from the data D corresponding to the binary first addresses BA1. In this example, the first parity codes PC1 are even parities, whereas odd parities may be used instead. The number of first parity codes PC1 is set at twice the number of bits of a binary first address BA1 ($2 \cdot \log_2(2n/m)$).

The first parity code L0A1 is generated from the data corresponding to the binary first addresses BA1 that have "0" in their least significant digits. That is, the first parity code L0A1 is generated from the data to be written/read under the physical bit addresses PA corresponding to binary first addresses BA1 "* ... *0" (* is an arbitrary value).

The first parity code H0A1 is generated from the data corresponding to the binary first addresses BA1 that have "1" in their least significant digits. That is, the first parity code H0A1 is generated from the data to be written/read under the physical bit addresses PA corresponding to binary first addresses BA1 "* ... *1" (* is an arbitrary value).

Similarly, the other first parity codes having an "L" are generated from the data corresponding to the binary first addresses BA1 that have "0" in respective predetermined digits thereof. The other first parity codes having an "H" are generated from the data corresponding to the binary first addresses BA1 that have "1" in respective predetermined digits thereof. In a write operation to the semiconductor memory, first parity codes PC1 generated in accordance with the write data to the memory cells (writing first parity codes) are written to a predetermined memory area along with the write data. Similarly, in a read operation to the semiconductor memory, first parity codes PC1 (reading first parity codes) are generated in accordance with the read data from the memory cells, and compared with the first parity codes PC1 that are generated in a write operation.

Under the rules shown in FIG. 21, first parity codes PC1 for error detection are also generated for the rest of the first groups A2, A3, ..., A(m/2).

FIG. 22 shows the correspondences among binary second addresses BA2, physical bit addresses PA, and data D to be stored in the respective bits when the second group B1 shown in FIG. 19 is sorted in order of the binary second addresses BA2.

FIG. 23 shows the combinations of binary second addresses BA2 and the expressions necessary for generating the second parity codes PC2 (H0B1, H1B1, ... H($\log_2(n/m)-1$)B1) for error correction in the second group B1. The second parity codes PC2 are generated from the data D corresponding to the binary second addresses BA2. The number of second parity codes PC2 is set at the number of bits of a binary second address BA2 ($\log_2(n/m)$). The second parity codes PC2 are used only to correct a two-bit error in the same memory cell within the first groups, and thus are generated in a smaller number.

The second parity code H0B1 is generated from the data corresponding to the binary second addresses BA2 that have "1" in their least significant digits. That is, the second parity code H0B1 is generated from the data to be written/read under the physical bit addresses PA corresponding to binary second addresses BA2 "* ... *1" (* is an arbitrary value).

Similarly, the other second parity codes, having an "H", are generated from the data corresponding to the binary second addresses BA2 that have "1" in respective predetermined digits thereof. In a write operation to the semiconductor memory, second parity codes PC2 generated in accordance with the write data to the memory cells (writing second parity codes) are written to a predetermined memory area along with the write data. Similarly, in a read operation to the semiconductor memory, second parity codes PC2 (reading second parity codes) are generated in accordance with the read data from the memory cells, and compared with the second parity codes PC2 that are generated in a write operation.

For the rest of the second groups B2, B3, ..., B(m/2), second parity codes PC2 for error correction are also generated as in FIG. 23.

Now, description will be given of a method for error detection/correction in the present invention.

Figure 24:
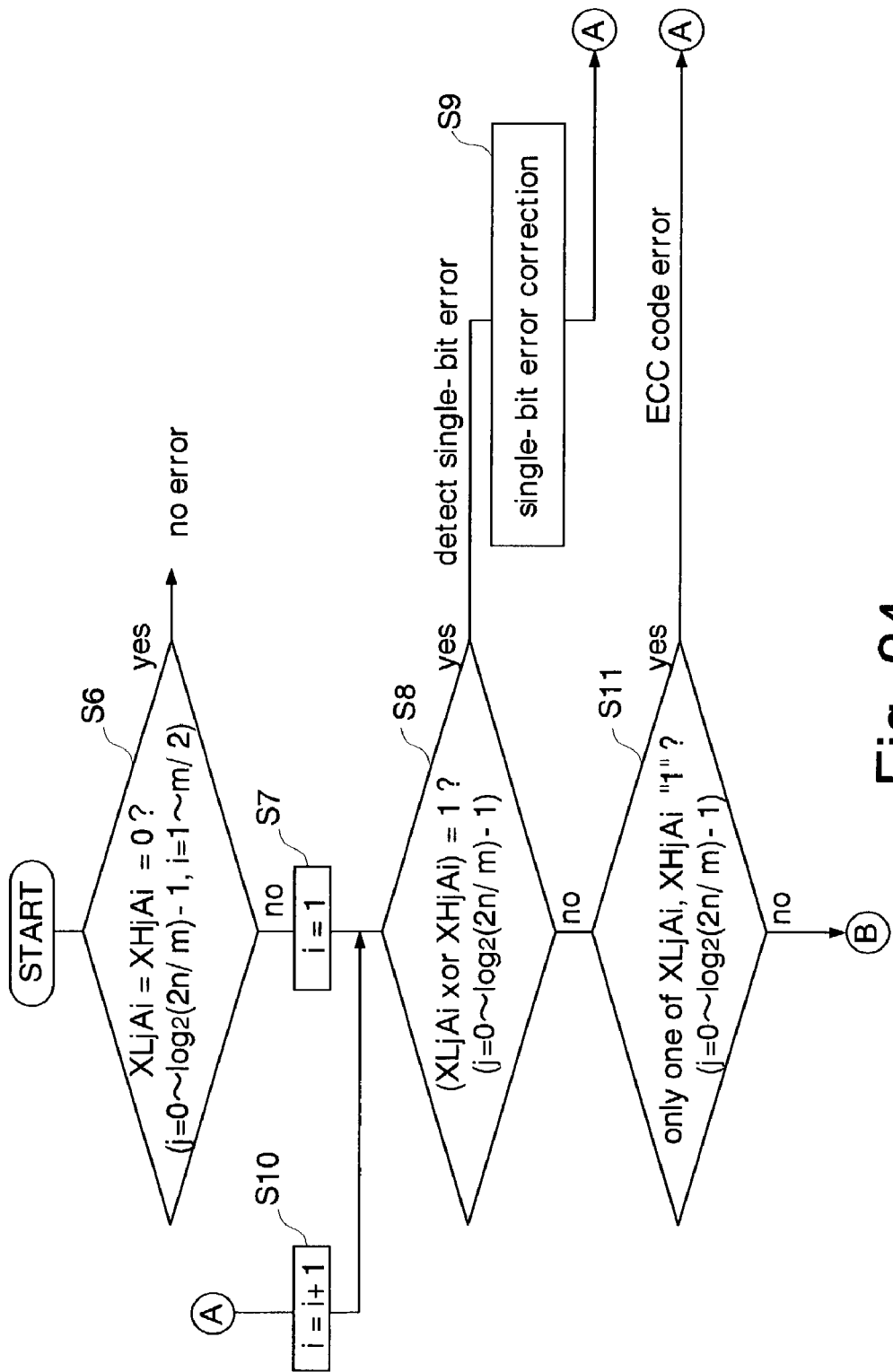
FIG. 24 is a flowchart showing a method for error detection/correction according to the second basic principle of the present invention.
Figure 25:
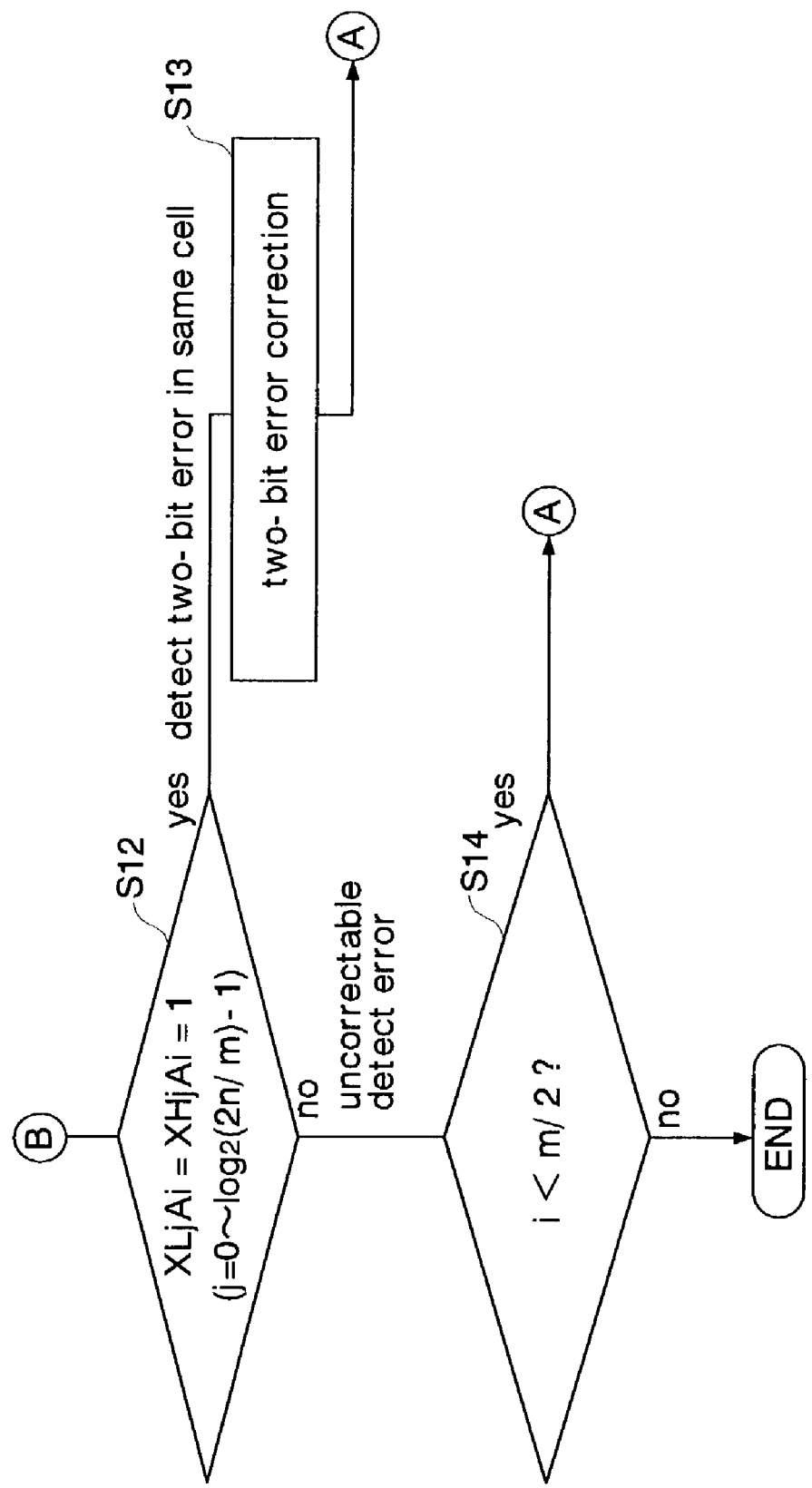
FIG. 25 is a flowchart showing the method for error detection/correction according to the second basic principle of the present invention.

FIGS. 24 and 25 show the flow for the error detection/correction to be performed by the multilevel cell memory described above. This flow is executed during data read operations. In the charts, XLjAi represents the exclusive OR of the first parity code LjAi (j=0 to $\log_2(2n/m)-1$) of write data and the first parity code LjAi (j=0 to $\log_2(2n/m)-1$) of read data in the first group Ai (i=1 to m/2). XHjAi represents the exclusive OR of the first parity code HjAi (j=0 to $\log_2(2n/m)-1$) of write data and the first parity code HjAi (j=0 to $\log_2(2n/m)-1$) of read data in the first group Ai (i=1 to m/2).

Initially, at step S6, whether XLjAi and XHjAi are "0" or not is determined across j=0 to $\log_2(2n/m)-1$ and i=1 to m/2. That is, all the first groups Ai are subjected to the determination if the two first parity codes PC1 corresponding to each identical digit of the binary first address BA1 are equal. If XLjAi and XHjAi are "0", a determination of no error is given. Then, the data read from the memory cells is simply output to exterior. If XLjAi and XHjAi are different from each other, the processing moves to step S7.

At step S7, "i" for designating a first group Ai is set at "1". The processing moves to step S8.

At step S8, whether or not XLjAi and XHjAi differ from each other across j=0 to $\log_2(2n/m)-1$ is determined. If XLjAi and XHjAi are all different from each other, a single-bit error is detected of the first group Ai. The processing then moves to step S9. If at least a pair of XLjAi and XHjAi is equal, the processing moves to step S11.

At step S9, single-bit error correction is performed. The single-bit error correction is effected by determining an error address as in the first basic principle described above (FIG. 2) and inverting the data read from the error address determined. The error address is given by the following expression (2):

$$\sum_{\log_2(2n/m)-1}^{k=0} (XHkAi \times 2^k) \quad (2)$$

After the correction of the single-bit error, the processing moves to step S10. At step S10, "i" for designating a first group Ai is incremented before the processing returns to step S8. That is, the next first group Ai is subjected to the error detection and error correction.

Now, at step S11, if only one of XLjAi and XHjAi is "1", a single-bit error is detected of the first parity codes themselves. The processing is then moves to step S10. Here, the data read from the memory cells is correct.

If more than one of XLjAi and XHjAi are "1", the processing moves to step S12 of FIG. 25. At step S12, whether or not XLjAi and XHjAi are "1" across j=0 to $\log_2(2n/m)-1$ is determined. If all of XLjAi and XHjAi are "1", a two-bit error in one single memory cell is detected of the first group Ai. The processing then moves to step S13. If XLjAi and XHjAi apply to none of steps S8, S11, and S12, two or more bits of error across two or more memory cells or two or more bits of error in a parity-containing memory cell is detected. The processing then moves to step S14. Such errors are uncorrectable.

At step S13, the two-bit error occurring in a single memory cell of the first group Ai in process is corrected. The two-bit error correction is effected by determining a cell address having the error as in the first basic principle described above (FIG. 3), and inverting the two bits of data read from the cell address determined.

Here, as shown in FIG. 19, each of the binary second addresses BA2 in the second group Bi corresponding to the first group Ai is assigned to a pair of binary first addresses BA1 for each memory cell. Thus, when a two-bit error occurs in a single memory cell of the first group Ai, the second parity codes PC2 to be generated from the second group Bi has a single-bit error pattern. The error address at this time is given by the following expression (3):

$$\sum_{\log_2(n/m)-1}^{k=0} (XHkBi \times 2^k) \quad (3)$$

Here, "XHkBi" represents the exclusive OR of the second parity code HjBi (j=0 to $\log_2(n/m)-1$) of write data and the second parity codes HjBi (j=0 to $\log_2(n/m)-1$) of read data in the second group Bi (i=1 to m/2).

Then, the data read from the bit corresponding to the error address given by the expression (3) and the bit corresponding to an address obtained by inverting every bit of the error address is inverted to correct the two bits of data. After the data correction, the processing moves to step S10 shown in FIG. 24.

Now, at step S14, whether or not all the first groups have undergone at least step 8 is determined. That is, it is determined if all the first groups are subjected to error detection after the determination of an error is given at step S6. If there is any first group Ai yet to be subjected to step S8, the processing moves to step S10 shown in FIG. 24. If all the first groups Ai have undergone step S8, the error detection/correction processing ends.

In this way, the semiconductor memory that stores more than two bits of data in each single memory cell subjects the individual first groups A to steps S8, S9, S11, S12, and S13, thus achieving error detection/correction by simple means.

Note that the foregoing second basic principle has been described for the case of memory cells having even numbers of bits. Where the present invention is applied to memory cells having odd numbers of bits, it is necessary only that the first group A(m/2) shown in FIG. 19 be assigned to a single bit per memory cell, and that the second group B(m/2) corresponding to the first group A(m/2) be eliminated.

As concerns the area for storing the first parity codes PC1 and the second parity codes PC2, each single bit of the first or second parity code PC1, PC2 is stored into a plurality of bits of a multilevel memory cell so that a multiple-bit error in the storing area of the parity bits can be coped with.

Figure 26:
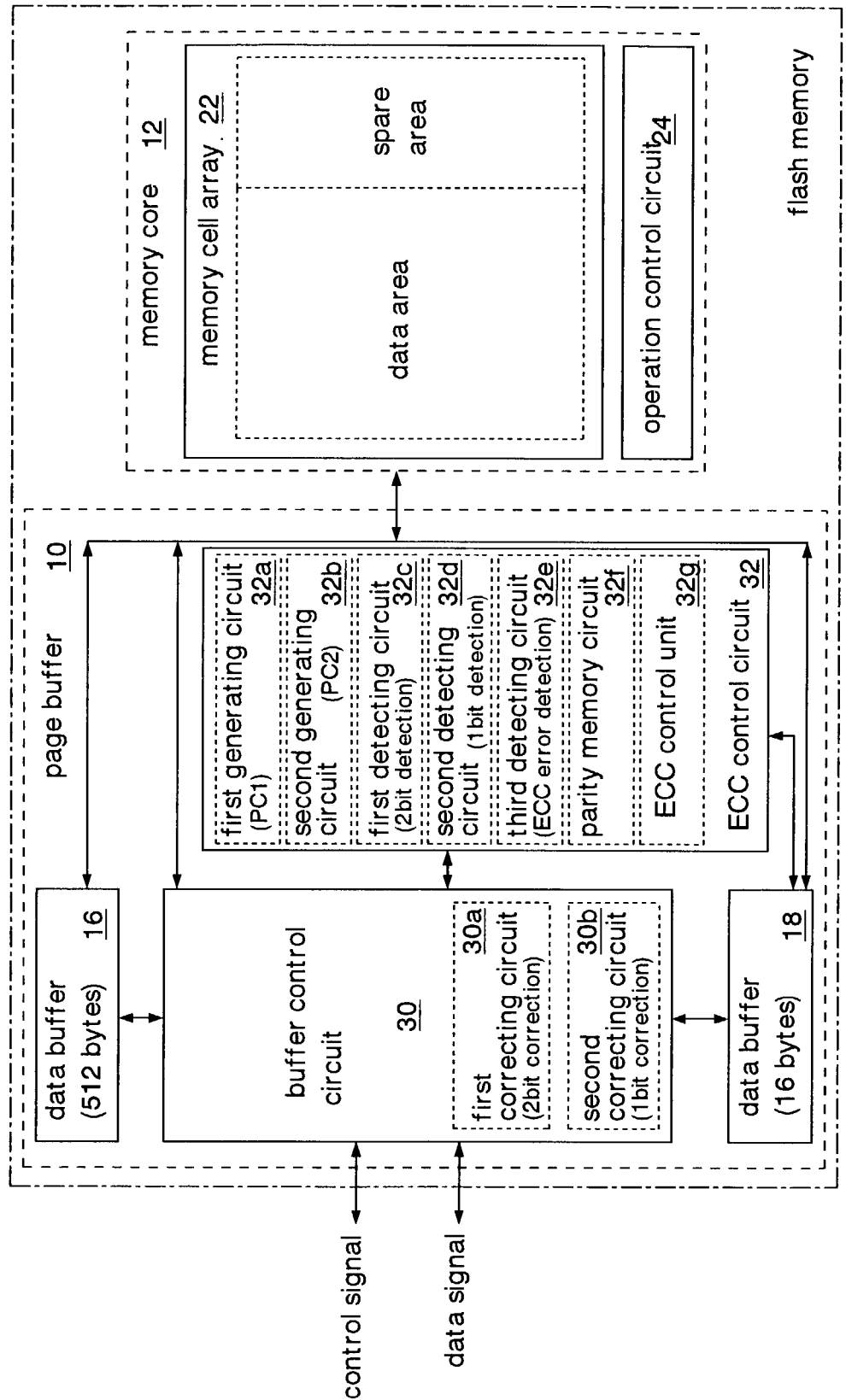
FIG. 26 is a block diagram showing a third embodiment of the present invention.

FIG. 26 shows a third embodiment of the present invention. The same elements as those described in the first embodiment will be designated by identical reference numbers. Detailed description thereof will be omitted.

The multilevel cell memory is formed as a floating gate type four-level flash memory capable of storing two bits of information in each single memory cell. In this flash memory, the amounts of carriers to be trapped in the floating gates of memory cells are adjusted in four levels according to write data (of four values). Then, four types of memory cell currents corresponding to the threshold voltages of the memory cells are detected to read two bits of data stored in the memory cells.

The flash memory in this embodiment includes a buffer control circuit 30 and an ECC control circuit 32, instead of the buffer control circuit 14 and the ECC control circuit 20 of the flash memory in the first embodiment. In other respects, the flash memory has almost the same configurations as those of the first embodiment. That is, read operations and write operations are performed page by page. Erase operations are performed page by page or in steps of a plurality of pages.

The buffer control circuit 30 has a first correcting circuit 30a for the two-bit error correction shown at step S13 of FIG. 25, and a second correcting circuit 30b for the single-bit error correction shown at step S9 of FIG. 24. The first correcting circuit 30a and the second correcting circuit 30b are almost the same as the first and second correcting circuits 14a and 14b in the first embodiment.

The ECC control circuit 32 has a first generating circuit 32a for generating first parity codes PC1, a second generating circuit 32b for generating second parity codes PC2, a first detecting circuit 32c for the single-bit error detection shown at step S8 of FIG. 24, a second detecting circuit 32d for the two-bit error detection shown at step S12 of FIG. 25, a third detecting circuit 32e for the ECC code error detection shown at step S11 of FIG. 24, a parity memory circuit 32f for storing the first and second parity codes PC1 and PC2, and an ECC control circuit 32g.

The first and second generating circuits 32a, 32b and the first and second detecting circuits 32c, 32d are almost the same as the first and second generating circuits 20a, 20b and the first and second detecting circuits 20c, 20d in the first embodiment. The parity memory circuit 32f has a plurality of multilevel memory cells, and stores a single bit of a first parity code PC1 (or second parity code PC2) in a plurality of bits of each multilevel memory cell.

Figure 27:
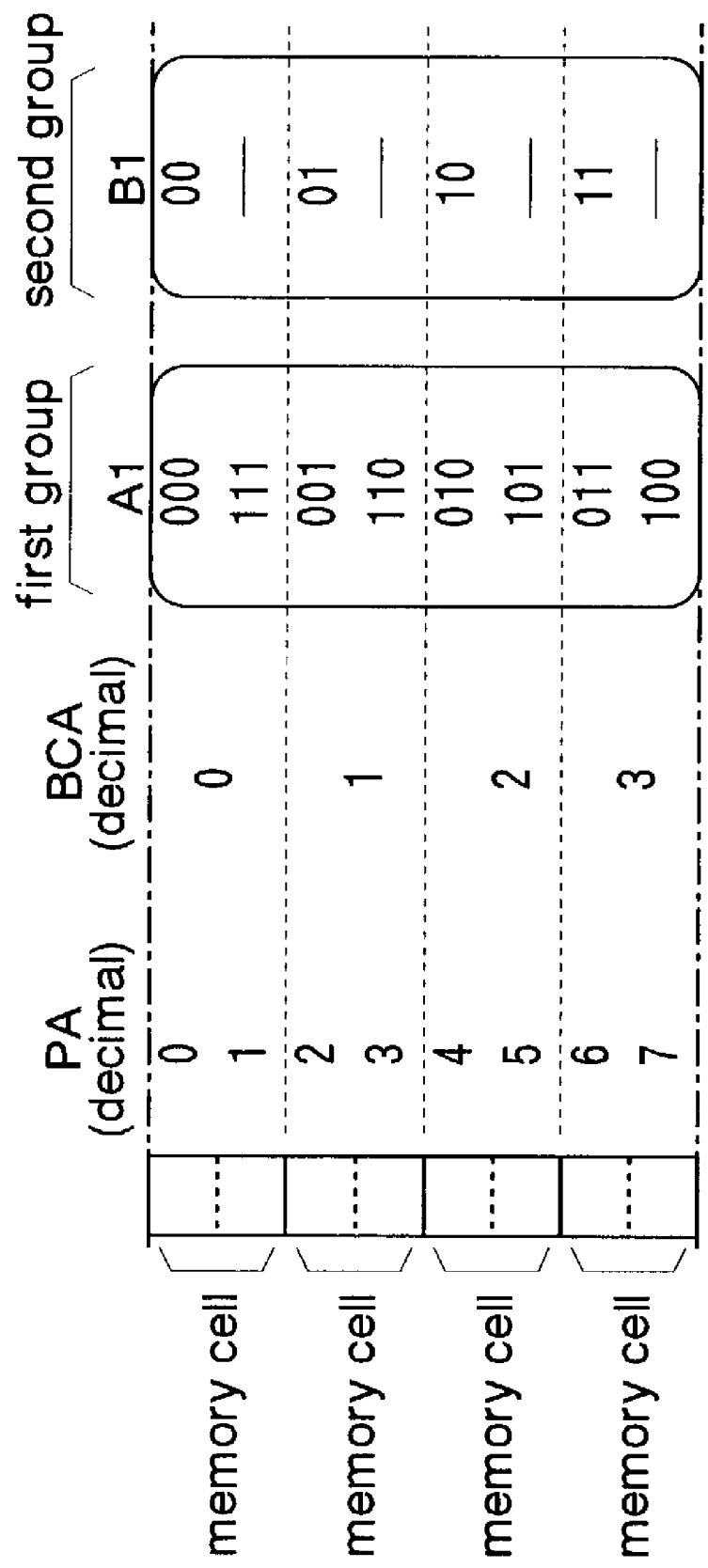
FIG. 27 is an explanatory diagram showing memory cell addressing in the third embodiment of the present invention.

The ECC control unit 32g operates the first and second generating circuits 32a, 32b and the first and second detecting circuits 32c, 32b with respect to each of the first groups Ai. That is, the ECC control circuit 32g is a circuit corresponding to steps S7, S10, and S14 of FIGS. 24 and 25. As shown in FIG. 27 to be seen later, this embodiment provides a single first group A1 and a single second group B1 alone. The ECC control unit 32g thus operates the first and second generating circuits 32a, 32b and the first and second detecting circuits 32c, 32d only once.

FIG. 27 shows memory cell addressing in the third embodiment. For ease of description, the number of memory cells to be accessed simultaneously in this example shall be four. That is, eight bits of data is read/written from/to memory cells by a single access. The individual bits of the memory cells are designated by physical addresses PA. The memory cells are designated by respective binary cell addresses BCA.

Since the memory cells store two bits each, there are provided a single first group A1 and a single second group Bi corresponding to this first group A1.

FIG. 28 shows the combinations of binary first addresses BA1 for generating the first parity codes PC1.

FIG. 29 shows the combinations of binary second addresses BA2 for generating the second parity codes PC2.

Figure 30:
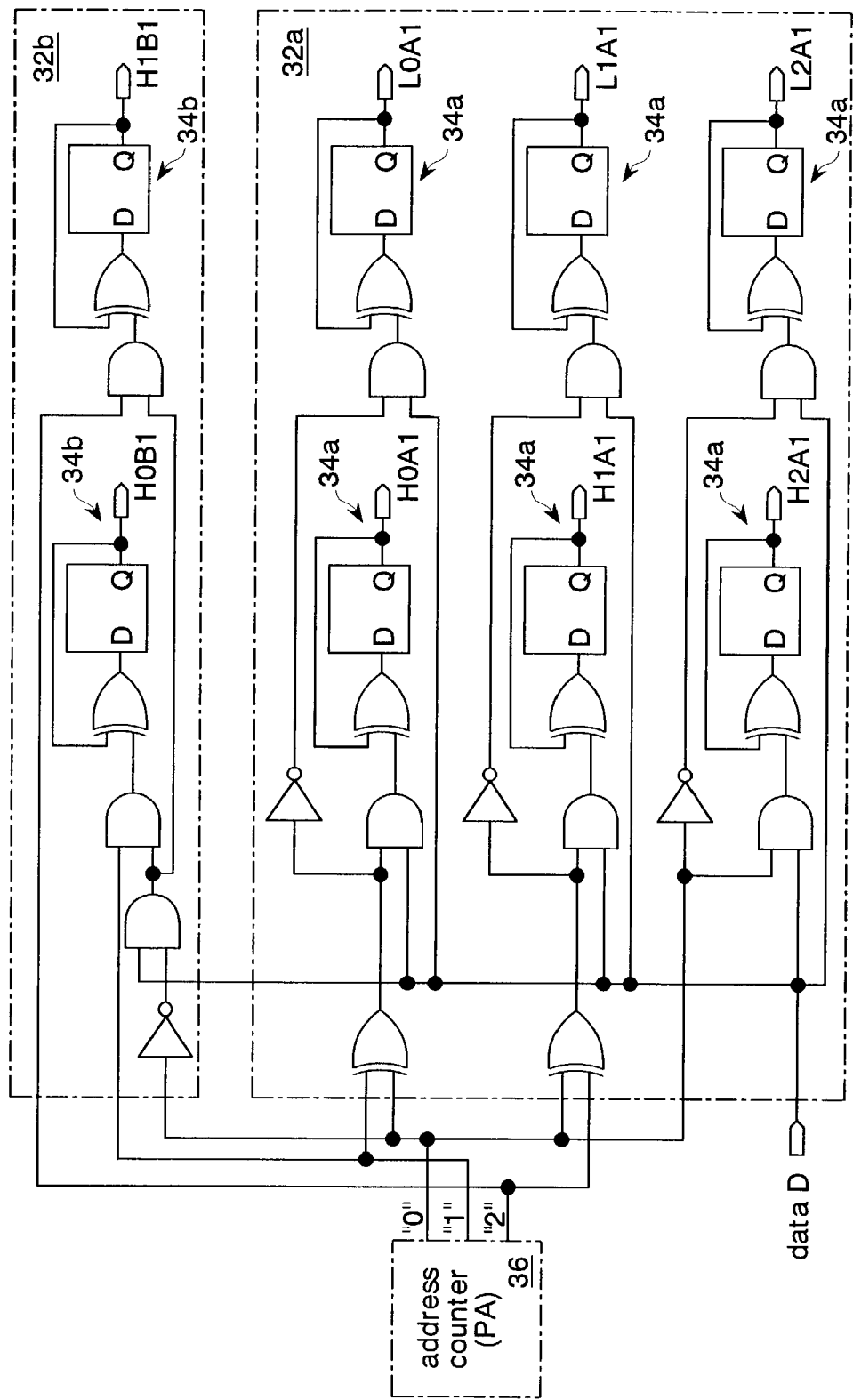
FIG. 30 is a circuit diagram showing the details of the first and second generating circuits in the third embodiment of the present invention.

FIG. 30 shows the details of the first generating circuit 32a and the second generating circuits 32b shown in FIG. 26. The first generating circuit 32a generates the first parity codes PC1 shown in FIG. 28 (L0A1, H0A1, L1A1, H1A1, L2A1, and H2A1). The second generating circuit 32b generates the second parity codes PC2 shown in FIG. 29 (H0B1 and H1B1).

The first generating circuit 32a is composed of six parity, calculating circuits 34a each having an EOR gate and a D flip-flop and calculating parity of data D, and a plurality of logic gates (EOR gates, AND gates, and inverters) for selecting the data D to be input to the parity calculating circuits 34 a according to the physical bit address PA. The parity calculating circuits 34a output a first parity code PC1 each.

The second generating circuit 32b is composed of two parity calculating circuits 34b each having an EOR gate and a D flip-flop and calculating parity of the data D, and a plurality of logic gates (AND gates and inverters) for selecting the data D to be input to the parity calculating circuits 34b according to the physical bit address PA. The parity calculating circuits 34b output a second parity code PC2 each.

The bits "0", "1", and "2" of the physical bit address PA to be supplied to the first and second generating circuits 32a and 32b are generated, for example, by an address counter 36. The address counter 36 is formed in the buffer control circuit 30 shown in FIG. 26 (omitted from FIG. 26). Then, in synchronization with the operation of the address counter 36, the data D corresponding to the physical address PA is supplied in series to generate first and second parity codes PC1 and PC2.

As has been described, in the present embodiment, the bit pairs of the memory cells are assigned to a plurality of first groups A, respectively. First parity codes PC1 and second parity codes PC2 are generated for the individual first groups A. Consequently, the presence of one memory cell having erroneous data in both bits of a bit pair thereof can be easily detected and corrected for each first group A. In addition, a single-bit error in a memory cell can be easily detected and corrected for each first group A.

Furthermore, the first groups A can be used to detect an error in the first parity codes PC1 themselves. The second groups B can be used to detect an error in the second parity codes PC2 themselves.

The first and second parity codes PC1 and PC2 both are stored simultaneously into a plurality of bits of multilevel memory cells in the parity memory circuit 32f. Consequently, even in the event of bit errors in the multilevel memory-cells in the parity memory circuit 32f, it is possible to read correct first and second parity codes PC1 and PC2 by majority logic or the like.

The invention is not limited to the above embodiments and various modifications maybe made without departing from the spirit and the scope of the invention. Any improvement may be made in part or all of the components.

What is claimed is:

1. A method for error detection/correction of a multilevel cell memory having memory cells each for retaining two bits of data, the method comprising the steps of:

assigning binary bit addresses, for error detection, said binary bit addresses designating individual bits of said memory cells such that each pair of said binary bit addresses corresponding to each of said memory cells is mutually exclusive in each digit;

generating, for each digit of said binary bit addresses, first parity codes including a parity code of write data corresponding to all of said binary bit addresses having "0" in said digit and a parity code of said write data corresponding to all of said binary bit addresses having "1" in said digit;

generating first parity codes of read data corresponding to said binary bit addresses whose combinations are the same as used in the generation of said first parity codes of said write data, when reading data from said memory cells; and detecting a presence of one memory cell storing erroneous data in both bits when said first parity codes generated in the read operation are all different from said first parity codes generated in the write operation.

2. The method for error detection/correction of a multi-level cell memory according to claim 1, further comprising the steps of:

assigning binary cell addresses, for error correction, designating said individual memory cells;

generating, for each digit of said binary cell addresses, a second parity code of data to be written to all memory cells with binary cell addresses having a selected value in said digit;

generating a second parity code of data read from said either of bits of said memory cells corresponding to said binary cell addresses whose combinations are the same as used in the generation of said second parity code of said write data when a presence of one memory cell storing erroneous data in both bits is detected;

obtaining exclusive ORs of individual bits of said second parity code generated in said write operation and individual bits of said second parity code generated in said read operation;

determining a binary cell address having an error by assigning the obtained exclusive ORs to designate respective digits of the address; and correcting the error by inverting two bits of data read from said memory cell having the error.

3. The method for error detection/correction of a multi-level cell memory according to claim 1, further comprising the steps of:

obtaining exclusive ORs of said first parity codes generated in said write operation and said first parity codes generated in said read operation;

detecting that data read from said memory cells includes a single-bit error when pairs of said exclusive ORs corresponding to complementary for each of said digits concerned at the generation of said first parity codes have complementary values;

determining a binary bit address having an error by assigning either exclusive OR of each of said pairs of exclusive ORs to designated a respective digit of the address; and correcting the error by inverting data corresponding to the determined binary bit address among said data read from said memory cells.

4. A multilevel cell memory having an error detection/correction function, comprising:

a plurality of memory cells each for retaining two bits of data;

a first generating circuit for assigning binary bit addresses, for error detection, designating individual bits of said memory cells, such that each pair of said binary bit addresses corresponding to each of said memory cells is mutually exclusive in each digit, generating, for each digit of said binary bit addresses, first parity codes including a parity code of write data corresponding to all of said binary bit addresses having "0" in said digit and a parity code of said write data corresponding to all of said binary bit addresses having "1" in said digit, and generating first parity codes of read data corresponding to said binary bit addresses whose combinations are the same as used in the generation of said first parity codes of said write data, when reading data from said memory cells; and a first detecting circuit for detecting a presence of one memory cell storing erroneous data in both bits when said first parity codes generated in the read operation are all different from said first parity codes generated in the write operation.

5. The multilevel cell memory having an error detection/correction function according to claim 4, further comprising:

a converting circuit for converting each bit of said first parity codes into two-bit data; and multilevel memory cells each for retaining said first parity codes as said two-bit data.

6. The multilevel cell memory having an error detection/correction function according to claim 4, further comprising:

a second generating circuit for assigning binary cell addresses, for error correction, to designating said individual memory cells, generating, for each digit of said binary cell addresses, a second parity code of data to be written to memory cells with binary cell addresses having a selected value in said digit, and generating a second parity code of data read from said memory cells corresponding to said binary cell addresses whose combinations are the same as used in the generation of said second parity code of said write data, when a presence of one memory cell storing erroneous data in both bits is detected; and a first correcting circuit for obtaining exclusive ORs of individual bits of said second parity code generated in said write operation and individual bits of said second parity code generated in said read operation, determining a binary cell address having an error by assigning the obtained exclusive ORs to designate respective digits of the address, and correcting the error by inverting two bits of data read from said one memory cell having the error.

7. The multilevel cell memory having an error detection/correction function according to claim 6, further comprising:

a converting circuit for converting each bit of said second parity codes into two-bit data; and multilevel memory cells each for retaining said second parity codes as said two-bit data.

8. The multilevel cell memory having an error detection/correction function according to claim 4, further comprising:

a second detecting circuit for obtaining exclusive ORs of said first parity codes generated in said write operation and said first parity codes generated in said read operation, and detecting that data read from said memory cells includes a single-bit error when pairs of said exclusive ORs corresponding to complementary values of each digit concerned at the generation of said first parity codes all have complementary values; and a second correcting circuit for determining a binary bit address having an error by assigning either exclusive OR of each of said pairs of exclusive ORs to designate respective digit of the binary bit address, and correcting the error by inverting data corresponding to the determined binary bit address among said data read from said memory cells.

9. A method for error detection/correction of a multilevel cell memory having memory cells each for retaining a plurality of bits of data, the method comprising the steps of:

constituting a plurality of first groups by selecting two bits from each of said memory cells as a bit pair; and, for each of said first groups, assigning two binary first addresses designating each bit of the bit pair for each of said memory cells such that said two binary first addresses are mutually exclusive in each digit, generating, for each digit of said binary first addresses, first parity codes including a parity code of write data corresponding to all of said binary first addresses having "0" in said digit and a parity code of said write data corresponding to all of said binary first addresses having "1" in said digit, generating first parity codes of read data corresponding to said binary first addresses whose combinations are the same as used in the generation of said first parity codes of said write data, when reading data from said memory cells, and detecting a presence of one memory cell storing erroneous data in both bits of a bit pair thereof in an area allocated to each of said first groups when said first parity codes generated in the read operation are all different from said first parity codes generated in the write operation.

10. The method for error detection/correction of a multilevel cell memory according to claim 9, further comprising the steps of:

constituting a plurality of second groups different from said first groups by selecting bits in combinations of said bit pairs defined for the first groups;

for each of said second groups, assigning binary second addresses, for error correction designating the bit pairs in individual memory cells, and generating, for each digit of said binary second addresses, second parity codes of write data corresponding to all of said binary second addresses having "0" in said digit or second parity codes of said write data corresponding to all of said binary first addresses having "1" in said digit; and, for each of said second groups, generating second parity codes of data read from said memory cells corresponding to said binary second addresses whose combinations are the same as used in the generation of said second parity codes of said write data, obtaining exclusive ORs of said second parity codes generated in the write operation and said second parity codes generated in the read operation when a presence of one memory cell storing erroneous data in both bits of a bit pair thereof is detected, determining a binary second address having an error by assigning the obtained exclusive ORs to designate respective digits of the binary second address, and correcting the error by inverting two bits of data read from said one memory cell having the error.

11. The method for error detection/correction of a multilevel cell memory according to claim 9, further comprising the steps of, for each of said first groups:

obtaining exclusive ORs of said first parity codes generated in the write operation and said first parity codes generated in the read operation;

detecting that data read from said memory cells includes a single-bit error when pairs of the exclusive ORs corresponding to each of the address digits concerned at the generation of the first parity codes are all inverted from each other;

determining a binary first address having an error by assigning one of each of said pairs of exclusive ORs to designate respective digits of the binary first address; and correcting the error by inverting data corresponding to the determined binary first address among said data read from said memory cells.

12. The method for error detection/correction of a multilevel cell memory according to claim 9, further comprising the steps of, for each of said first groups:

obtaining exclusive ORs of said first parity codes generated in the write operation and said first parity codes generated in the read operation; and detecting that said first parity codes include a single-bit error when only one of the exclusive ORs is "1".

13. A multilevel cell memory having an error detection/correction function, comprising:

a plurality of memory cells each for retaining a plurality of bits of data;

a plurality of first groups each being constituted by selecting one of two bits from each of said memory cells;

a first generating circuit for assigning two binary first addresses respectively designating one bit of each bit pair of said memory cells for each of said first groups such that said two binary first addresses are mutually exclusive in each digit, generating, for each digit of said binary first addresses, first parity codes including a parity code of write data corresponding to all of said binary first addresses having "0" in said digit and a parity code of said write data corresponding to all of said binary first addresses having "1" in said digit, for each of said first groups, and generating, for each of said first groups, first parity codes of read data corresponding to said binary first addresses whose combinations are the same as used in the generation of said first parity codes of said write data, when reading data from said memory cells; and a first detecting circuit for detecting, for each of said first groups, a presence of one memory cell storing erroneous data in both bits of a bit pair thereof in an area allocated to each of said first groups when said first parity codes generated in the read operation are all different from said first parity codes generated in the write operation.

14. The multilevel cell memory having an error detection/correction function according to claim 13, further comprising:

a plurality of second groups independent of said first groups and each being constituted by selecting combinations of both bits of said bit pairs of the respective first groups;

a second generating circuit for assigning binary second addresses, for error correction, designating the individual memory cells, for each of said second groups, generating, for each digit of said binary second addresses, second parity codes of write data corresponding to all of said binary second addresses having "0" in said digit or second parity codes of said write data corresponding to all of said binary second addresses having "1" in said digit, and generating, second parity codes of data read from said memory cells corresponding to said binary second addresses whose combinations are the same as used in the generation of said second parity codes of said write data; and a first correcting circuit for obtaining, when one memory cell storing erroneous data in both bits of a bit pair thereof is detected, exclusive ORs of individual bits of said second parity codes generated in the write operation and individual bits of said second parity codes generated in the read operation, determining a binary second address having an error by assigning the obtained exclusive ORs to designate respective digits of the binary second address, and correcting the error by inverting two bits of data read from said one memory cell having the error.

15. The multilevel cell memory having an error detection/correction function according to claim 13, further comprising:

a second detecting circuit for obtaining, for each of said first groups, exclusive ORs of said first parity codes generated in the write operation and said first parity codes generated in the read operation, and detecting, for each of said first groups, that in the area allocated to each of said first groups data read from said memory cells includes a single-bit error when all pairs of exclusive ORs corresponding to complementary values for each of said address digits concerned at the generation of said first parity codes are all inverted from each other; and a second correcting circuit for
determining, for each of said first groups having a single-bit error detected, a binary first address having the detected error by assigning either exclusive OR of said pairs of exclusive ORs to designate respective digits of the address; and
correcting the error for each of said first groups by inverting data corresponding to the determined binary first address among said data read from said memory cells.

16. The multilevel cell memory having an error detection/correction function according to claim 13, further comprising a third detecting circuit for obtaining, for each of said first groups, exclusive ORs of said first parity codes generated in the write operation and said first parity codes generated in the read operation, and for detecting that said first parity codes include a single-bit error when only one of the exclusive ORs is "1".

17. The multilevel cell memory having an error detection/correction function according to claim 13, further comprising a parity memory circuit having a plurality of multilevel memory cells for storing said first parity codes, respectively, wherein
said first parity codes are simultaneously stored into a plurality of bits of the respective multilevel memory cells in said parity memory circuit.

* * * * *